United States Patent
Stojanovic

(10) Patent No.: US 8,837,656 B2
(45) Date of Patent: Sep. 16, 2014

(54) PHASE DETECTION METHOD AND CIRCUIT

(75) Inventor: Nebojsa Stojanovic, Nuremberg (DE)

(73) Assignee: Cisco Technology, Inc., San Jose, CA (US)

( * ) Notice: Subject to any disclaimer, the term of this patent is extended or adjusted under 35 U.S.C. 154(b) by 298 days.

(21) Appl. No.: 13/174,869

(22) Filed: Jul. 1, 2011

(65) Prior Publication Data

US 2012/0008723 A1    Jan. 12, 2012

(30) Foreign Application Priority Data

Jul. 6, 2010  (EP) .................................... 10168601

(51) Int. Cl.
*H04L 7/00* (2006.01)

(52) U.S. Cl.
USPC ......................................................... 375/355

(58) Field of Classification Search
USPC ......................................................... 375/355
See application file for complete search history.

(56) References Cited

U.S. PATENT DOCUMENTS

| | | | |
|---|---|---|---|
| 4,635,103 A * | 1/1987 | Steckler et al. | 348/505 |
| 4,785,352 A * | 11/1988 | Burrowes et al. | 348/678 |
| 5,297,172 A | 3/1994 | Shenoy et al. | |
| 2002/0027963 A1 | 3/2002 | Imanaka et al. | |
| 2002/0154430 A1 * | 10/2002 | Rae et al. | 360/25 |
| 2008/0089443 A1 * | 4/2008 | Sanada et al. | 375/319 |

FOREIGN PATENT DOCUMENTS

EP        1045545 A2    10/2000

OTHER PUBLICATIONS

Partial International Search Report in counterpart International Application No. PCT/US11/42742, mailed Oct. 6, 2011.
International Search Report and Written Opinion in corresponding International Application No. PCT/US2011/042742, mailed Mar. 30, 2012.

* cited by examiner

*Primary Examiner* — Shuwang Liu
*Assistant Examiner* — Nader Bolourchi
(74) *Attorney, Agent, or Firm* — Edell, Shapiro & Finnan, LLC

(57) ABSTRACT

Phase detection methods are provided. According to a first embodiment, a signal is sampled in order to obtain an amplitude sample. Then an absolute value of the difference of the amplitude sample minus an average of amplitude samples is calculated. According to a second embodiment, the signal is sampled at a first and second phase. This results in first and second amplitude samples which are compared to a first and second plurality of thresholds, respectively, in order to assign first and second weighting values to each first and second amplitude sample, respectively, depending on to which range between two adjacent thresholds the first and second amplitude sample belong. Then the sum or difference of said first and second weighting values is calculated.

15 Claims, 13 Drawing Sheets

251

| X | P1(X) | P2(X) |
|---|---|---|
| -7 | 0 | 7 |
| -6 | 0 | 6 |
| -5 | 0 | 5 |
| -4 | 0 | 4 |
| -3 | 0 | 3 |
| -2 | 0 | 2 |
| -1 | 0 | 1 |
| 0 | 1 | 0 |
| 1 | 2 | 1 |
| 2 | 2 | 2 |
| 3 | 2 | 3 |
| 4 | 2 | 4 |
| 5 | 2 | 5 |
| 6 | 2 | 6 |
| 7 | 2 | 7 |

201

| X | P1(X) | P2(X) |
|---|---|---|
| 1 | 0 | 4 |
| 2 | 0 | 3 |
| 3 | 0 | 2 |
| 4 | 0 | 1 |
| 5 | 1 | 1 |
| 6 | 1 | 2 |
| 7 | 1 | 3 |
| 8 | 1 | 4 |

PHASE DETECTION METHOD AND CIRCUIT

This application claims foreign priority under 35 U.S.C. §119(a)-(d) to European Patent Application No. EP 10168601.2, filed on Jul. 6, 2010, entitled "Phase Detection Method and Circuit," the entire contents of which is hereby incorporated by reference.

BACKGROUND

This present application pertains to a phase detection method for clock recover by utilizing a phase detector that evaluates pulse shape features.

Timing recovery is a critical receiver function in high-speed communication systems. The receiver clock must be continuously adjusted in its frequency and phase to optimize the sampling instants of the received data signal and to compensate for frequency drifts between the oscillators used in the transmitter and receiver clock circuits. Usually, a clock synchronizer should perform both functions. In some cases an additional phase adjustment is needed.

Gardner, "Phaselock Techniques" Wiley, 1970, is a classical text on phase-locked loops (PLLs). Buchwald, Martin describes in "Integrated Fiber-Optic Receivers", Kluwer, 1995, in particular chapter 4 (later referred to as Buchwald), many state-of the art clock recovery solutions for broadband communication systems e.g. high speed optical systems). Bergmans, "Digital Baseband Transmission and Recording", Kluwer, 1996, in particular chapter 9, provides a modern classification and introduces the timing error detector (TED) terminology. Although timing error or phase error may be considered to be more precise we prefer the phase detector terminology because it is used by practitioners. Meyr, Moeneclaey, Fechtel, "Digital Communication Receivers", Wiley, 1998, chapter 2, (later referred to as Meyr) explains terminology and introduces performance analysis methods for TEDs.

One kind of timing recovery methods, which are also referred to as self-timing or clock synchronizing methods, exploits some of pulse shape characteristics described e.g. by B. R. Saltzberg in "Timing recovery for synchronous binary data transmission", Bell. Syst. Tech. J., vol. 46, pp. 593-622, March 1967. The most frequently used synchronizers of this class compare the threshold crossings of the received baseband signal with the sampling phase. The mean location of the crossings is estimated and the optimum sampling instant and maximum eye opening are assumed to be halfway between these crossings as e.g. described by J. D. H. Alexander in "Clock Recovery from Random Binary Data", Elect. Lett., vol. 11, pp. 541-542, October 1975 and by C. R. Hogge in "A Self-Correcting Clock Recovery Circuit", IEEE J. Lightwave Tech., vol. 3, pp. 1312-1314, December 1985. More specifically, in accordance with the so-called Alexander's clock recovery and data retiming circuit, three binary samples of the data signal are available: a is the previous data value, b is a sample of the data at the transition and c is the current data value. If a=b≠c the clock is early and should be slowed down. If a≠b=c the clock is late and should be speeded up. If a=b=c no data transition occurred and nothing should be done in this case. The case a=c≠b should not happen in phase-lock but it may occur due to frequency error or due to high noise.

A similar disclosure can also be found in patent literature. B. Joseph, H. Syang-Myau and R. Roopa describe in WO 02/30035 A1 titled "SYMBOL TIMING RECOVERY METHOD FOR LOW RESOLUTION MULTIPLE AMPLITUDE SIGNALS" (Apr. 11, 2002) symbol timing in a system, which does not provide a carrier corresponding to a symbol frequency. By collecting a histogram of samples for a predetermined number of symbol times symbol edges and a maximum eye opening are determined. Specifically an average, weighted average, or other method is applied to determine an average timing for maximum eye opening for each symbol time. Eight-fold over-sampling is employed.

A data-aided synchronizer described by K. H. Mueller and M. Müller in "Timing recovery in digital synchronous data receivers", IEEE Trans. Commun., vol. COM-24, pp. 516-531, May. 1976, uses the sampled signal and receiver decisions for producing the timing function. This method yields relatively high variance estimates of the timing error, which is avoided in data selective methods as e.g. explained by A. Jennings and B. R. Clarke in "Data-Sequence Selective Timing Recovery for PAM Systems", IEEE Trans. Commun., vol. COM-33, pp. 729-731, July. 1985.

European patent application number 03004079.4 and PCT application PCT/EP2004/001838 both titled "Self-timing method for adjustment of a sampling phase in an oversampling receiver and circuit" disclose a self-timing method and circuit for receivers performing two-fold oversampling. Histograms of the quantized amplitudes are measured for each of the two sampling instants and a measure of histogram similarity called population difference parameter is either maximized or minimized. More specifically, the quantized amplitudes are counted wherein one counter is provided for each possible digital value and each sampling instant. Then the absolute difference is calculated between the counters of a counter pair which count the same digital value at the two different sampling instants. The sum of all absolute differences of all counter pairs is referred to as population difference parameter. Finally, the sampling phase(s) is adjusted that the population difference parameter is maximized or minimized.

The best timing phase for a given system depends on the overall impulse response and thus on the characteristics of the communication channel.

Besides noise, most problems disturbing timing recovery circuits in optical data transmission systems are caused by signal distortions, particularly due to intersymbol interference (ISI), from chromatic dispersion, polarization mode dispersion, self-phase modulation etc. To the best of our knowledge, none of the well-known synchronizers (cf. e.g. Buchwald) used in current practical systems is able to cover such a wide spectrum of distortion as synchronizers comprising a phase detector described in this patent. We will constrain the invention explanation to the case of binary optical transmission. However, this fact does not limit the application of the inventive synchronizer in arbitrary binary or multilevel PAM (Pulse Amplitude Modulation) transmission systems.

Further, the Gray code is known (U.S. Pat. No. 2,632,058). It is an encoding scheme of numbers so that adjacent numbers have a single digit differing by 1. The relevant Gray codes for this application are:

TABLE 1

| | decimal | | | | | | | |
|---|---|---|---|---|---|---|---|---|
| | 0 | 1 | 2 | 3 | 4 | 5 | 6 | 7 |
| Gray | 000 | 001 | 011 | 010 | 110 | 111 | 101 | 100 |

The Gray code is called reflected because it can be generated recursively. Starting from a Gray code having $2^q$ binary digits (e.g. q=1, Gray code: 0, 1). Write it forwards, then backwards (0, 1, 1, 0). Then prepend 0s to the first half and 1s to the second half (00, 01, 11, 10) in order to obtain a Gray code having $2^{q+1}$ digits.

It is the object of this invention to provide a robust phase detection method and a corresponding circuit that will be able to cope with serious distortions present in optical transmission systems.

BRIEF DESCRIPTION OF THE DRAWINGS

In the following preferred embodiments of this invention are described, with reference to the accompanying drawings.

FIG. 11 shows a look-up table for two discrete functions of a third embodiment;

FIG. 13 shows a look-up table for two discrete functions of the fifth embodiment;

FIG. 14 shows equations for calculating quantized samples X, Y and Z of the fifth embodiment;

DETAILED DESCRIPTION

Overview

A phase detection method and circuit are provided that can work on severely distorted channels and cope with noise, chromatic dispersion and polarization mode dispersion present in optical signals both for receivers with Baud rate data sampling and for receivers using two samples per bit for data detection. For example, phase detectors utilizing edge detection behave unacceptable in the presence of pulse broadening, e.g. due to chromatic dispersion, because the edges spread out in time and even disappear. The timing function amplitudes of such timing methods decay rapidly with increasing chromatic dispersion until the clock extraction becomes impossible.

Figure 8:
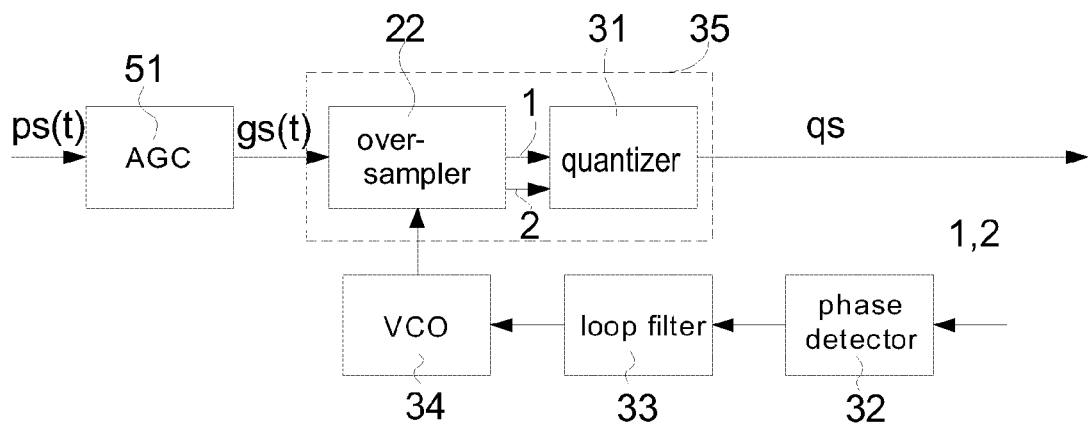
FIG. 8 shows a synchronizer block diagram of an embodiment using a single ADC (sampler and quantizer) for both, phase detection and data detection.

In receivers using over-sampling the realization of the proposed synchronizer becomes very simple as shown in FIG. 8. An inventive phase detector circuit can then be integrated into an existing analog-to-digital converter (ADC).

The inventive phase detector allows a PLL to lock and then track jitter even under severe signal distortions, i.e. it does not develop timing function defects that are observed for conventional wideband phase detectors.

| Abbreviations | | | |
|---|---|---|---|
| ADC | Analog-to-digital converter | LSB | least significant bit |
| AGC | Automatic gain control | ISI | Intersymbol interference |
| BER | Bit error rate | MSB | most significant bit |
| CHD | Chromatic dispersion | NRZ | non-return to zero |
| CR | Clock recovery | OSNR | Optical signal-to-noise ratio |
| DAC | digital-to-analog converter | PAM | Pulse amplitude modulation |
| DGD | Differential group delay | PCF | Power coupling factor |
| ECC | Error correcting code | PLL | Phase-locked loop |
| FSE | Fractionally spaced equalizer | PMD | Polarisation mode dispersion |
| RD | Residual chromatic dispersion | VCO | Voltage controlled oscillator |
| qs | quantized samples | | |
| SPA | Sampling phase adjustment | | |
| TEDC | Timing error detector characteristic | | |
| Mathematical Symbols | | | |
| A | first sample in a symbol period | s(t) | electrical, DC-free signal |
| B | second sample in a symbol period | ps(t) | s(t), but before the AGC |
| $f_d$ | data rate | $S_i$ | subinterval (i = 1 . . . 5) |
| $G_1, G_2$ | thresholds | $s_Y(n)$ | sampled signal |
| gs(t) | gain controlled signal | T | symbol or bit period |
| n | time slot index | τ | phase offset |
| P1 | sign function | $U_{AGC}$ | signal strength |
| P2 | absolute value function | $U_{AGC,ref}$ | AGC reference value |
| q | resolution (bits) | $w_{yi}$ | weighting factor |
| Q(s(t)) | quantization function | φ | A or B |
| $|s|$ | mean rectified value of s(t) | X, Y, Z | quantized samples |

Example Embodiments

The new timing recovery method according to the invention belongs to the class of clock synchronizers that exploit pulse shape characteristics.

First Embodiment

According to a first embodiment, there are three main steps yielding the timing function:
- the received signal is over-sampled at twice the data rate
- the signal amplitude range is divided non-uniformly in several subintervals, which are used to determine the amplitude subinterval of sampled signal
- depending on the subinterval including the sampled signal, the phase detector generates a signal associated with that particular subinterval.

As usual, the output of phase detector is passed through a loop filter, which often includes a low-pass filter, in order to smooth the phase detector output.

Figure 1:
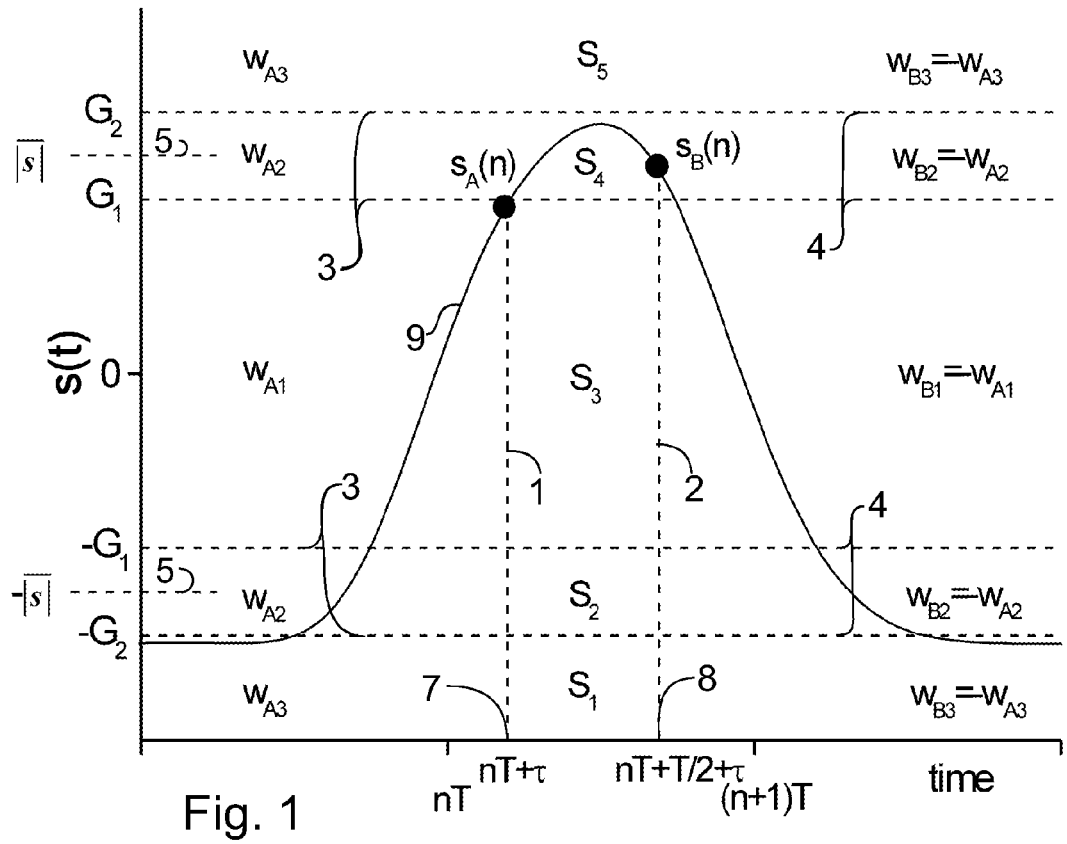
FIG. 1 shows a schematic example of the symbol response to an isolated "1" and sampling instants for 2-fold oversampling.

After optical-to-electrical conversion, a typical symbol response 9 has a shape as presented in FIG. 1. The optical channel and finite bandwidth of transmitter and receiver have introduced inter-symbol interference that is visible in FIG. 1. In FIG. 1, the 1 is transmitted between nT and (n+1)T, wherein T designates a symbol period and n is a time slot index.

For sake of simpler exposition, we assume that the electrical signal after the AGC is DC free, which is not a constraint to the application. Alternatively, s(t) may denote the difference between the electrical signal and a low pass filtered electrical signal or the moving average of the electrical signal in order to ensure DC freeness.

We will consider an embodiment in which the amplitude range is divided into five subintervals $S_i$, $i \in \{1, 2, \ldots, 5\}$ as shown in FIG. 1 and each of the intervals is assigned one of six weighting values $w_{\phi i}$, $\phi \in \{A, B\}$, $i \in \{1, 2, 3\}$. The weighting values are chosen symmetrically to the zero amplitude level of DC-free signal s(t).

For some specific purposes more subintervals than five could improve clock recovery performance. The choice of subintervals and weighting values depends on the transmission scenario. Five subintervals provide very good performance for severely distorted optical channels.

The received signal is sampled twice in one bit interval. The first "odd numbered" sample 1 and the second "even numbered" sample 2 within a symbol period T are referred to as A sample and B sample, respectively. Sampled signal in $n^{th}$ bit period is denoted as $s_\phi(n)$, $\phi \in \{A, B\}$. We can write $$s_A(n) = s(nT + \tau) \quad (1)$$

$$s_B(n) = s\left(nT + \frac{T}{2} + \tau\right) \quad (2)$$

where $\tau$ is a time delay and $$f_d = \frac{1}{T}$$

is the data rate. In the general case of imperfect clock synchronization $\tau$ also depends on n. Only if the recovered clock frequency is identical to the frequency of the received data, $\tau$ becomes independent from n. On the other hand, in this document only samples taken during the same symbol period or in neighboring symbol periods are considered. If the frequencies differ only slightly, the dependency of $\tau$ from n can be ignored, which is done in the remainder of this document.

The phase detector converts sampled signals to the corresponding weighting values as $$w_A(n) = W(s_A(n)) = W(s(nT + \tau)) \quad (3)$$

$$= \begin{cases} w_{A1}, & |s_A(n)| \le G_1 \\ w_{A2}, & G_1 < |s_A(n)| \le G_2 \\ w_{A3}, & G_2 < |s_A(n)| \end{cases}$$

$$w_B(n) = W(s_B(n)) = W\left(s\left(nT + \frac{T}{2} + \tau\right)\right) \quad (4)$$

$$= \begin{cases} w_{B1} = -w_{A1}, & |s_B(n)| \le G_1 \\ w_{B2} = -w_{A2}, & G_1 < |s_B(n)| \le G_2 \\ w_{B3} = -w_{A3}, & G_2 < |s_B(n)| \end{cases}$$

$G_1$ and $G_2$ designate thresholds. In FIG. 1 reference numeral 3 designates thresholds for A samples 1 and reference numeral 4 designates thresholds for the B samples 2. Thresholds may be chosen differently for A and B samples and not necessarily symmetrical around 0. For the embodiment illustrated in the figures, the same thresholds are chosen for A and B samples.

$$PDout(i) = w_A(i) + w_B(i) = W(s(iT + \tau)) + W\left(s\left(iT + \frac{T}{2} + \tau\right)\right) \quad (5)$$

The phase detector output itself is PDout(i) which is filtered by loop filter 24, 33 or 306, depending on the embodiment and on application dependent PLL design targets. It does not really matter as to whether a positive phase detector output increases or decreases the clock frequency. In case of an increase the left zero crossing in FIG. 2 near $\tau=0.25T$ is stable. Otherwise the right zero crossing near $\tau=0.75T$ is stable.

Obviously, equations (4) and (5) may be replaced equivalently by equations (6) and (7), respectively. The latter presentation exploits symmetry and only requires three weighting values $w_{Ai}$ which are assigned in the same way to A and B samples.

$$w_B(n) = W(s_B(n)) = W\left(s\left(nT + \frac{T}{2} + \tau\right)\right) \quad (6)$$

$$= \begin{cases} w_{A1}, & |s_B(n)| \le G_1 \\ w_{A2}, & G_1 < |s_B(n)| \le G_2 \\ w_{A3}, & G_2 < |s_B(n)| \end{cases}$$

$$PDout(i) = w_A(i) - w_B(i) = W(s(iT + \tau)) - W\left(s\left(iT + \frac{T}{2} + \tau\right)\right) \quad (7)$$

Weighting coefficients and amplitude subintervals have been selected to optimize clock recovery performance for a wide range of distortion present in optical channels:

$$G_1 = 0.8|\bar{s}|, G_2 = 1.2|\bar{s}|, w_{A1} = -0.5, w_{A2} = 1, w_{A3} = 0 \quad (8)$$

$$|\bar{s}| = \lim_{n \to \infty} \frac{1}{nT} \int_0^{nT} |s(t)| \, dt \quad (9)$$

where $|\bar{s}|$ denotes the mean rectified value of the signal s(t), assuming that s(t) is DC free. An expression for the general case will be given in equation (23).

A probably easier to understand interpretation of what the phase detector does is as follows.

Effectively the phase detector can be viewed to detect and classify AB-transitions, by means of clever weight assignments. Some transition classes cause an impulse to advance phase e.g. mid-high transitions and mid-low transitions, some to delay phase, e.g. high-mid transitions and low-mid transitions, and some to maintain phase constant e.g. high-high or low-low transitions, etc. To each of the classes (advance, delay, maintain) different strengths of phase adjustment can be assigned.

So the formerly presented "weight assignment" view in which A and B ADCs generate output pulses in a mutually independent way can be supplemented by a more general "transition search-and-classify" picture in which A and B samples are jointly evaluated to generate the output pulses based on the pairs of A and B samples. This "transition search-and-classify" picture can be easily further generalized to the case of L-fold oversampling: here the phase detector logic works on the L samples to classify the transitions in an arbitrary way by using 2 to L samples to detect a transition belonging to a relevant class and to assign different strengths of phase adjustment to the distinguished classes.

In the description of the embodiments of this invention, ADC is to be understood as having the functionalities of both, a quantizer and a sampler. A quantizer converts an analogue signal in discrete values. A sampler extracts a value at discrete points in time. The expression ADC does not yet specify the order of sampler and quantizer. Conventionally, an analog sampler samples and holds an analog signal and the following quantizer converts the held, constant signal into a digital value. In high-speed applications so-called flash ADCs (cf FIG. 15) are used, in which a resistor ladder and a bench of comparators (cf FIG. 16) quantize an analogue signal and a bench of flip-flops (cf FIG. 15, 302, FIG. 17) sample the quantized signals.

In a modification of the first embodiment, the four thresholds $-G_2, -G_1, G_1$ and $G_2$, which are chosen symmetrically to the zero-line in FIG. 1, may be chosen asymmetrically to the zero-line in order to compensate for a non-linear characteristic of the transmission channel and/or the optical-to-electrical converter. The applicant's internal reference of the first embodiment is PD46.

Second Embodiment

The second embodiment is an un-quantized version of a third embodiment described below. This embodiment is illustrated by the flowchart shown in FIG. 10. $s_\phi(n)$, $\phi \in \{A, B\}$ are defined by equations (1) and (2). The weighting values $w_1(n)$ and $w_2(n)$ are defined by equations (10) and (11):

$$w_1(n) = \begin{cases} 1 & \text{if } s_B(n-1)s_A(n) < 0 \text{ and } |s_B(n-1)| < |s_A(n)| \\ -1 & \text{if } s_B(n-1)s_A(n) < 0 \text{ and } |s_B(n-1)| > |s_A(n)| \\ 0 & \text{otherwise} \end{cases} \quad (10)$$

$$w_2(n) = \begin{cases} 1 & \text{if } s_A(n)s_B(n) < 0 \text{ and } |s_B(n)| < |s_A(n)| \\ -1 & \text{if } s_A(n)s_B(n) < 0 \text{ and } |s_B(n)| > |s_A(n)| \\ 0 & \text{otherwise} \end{cases} \quad (11)$$

Figure 10:
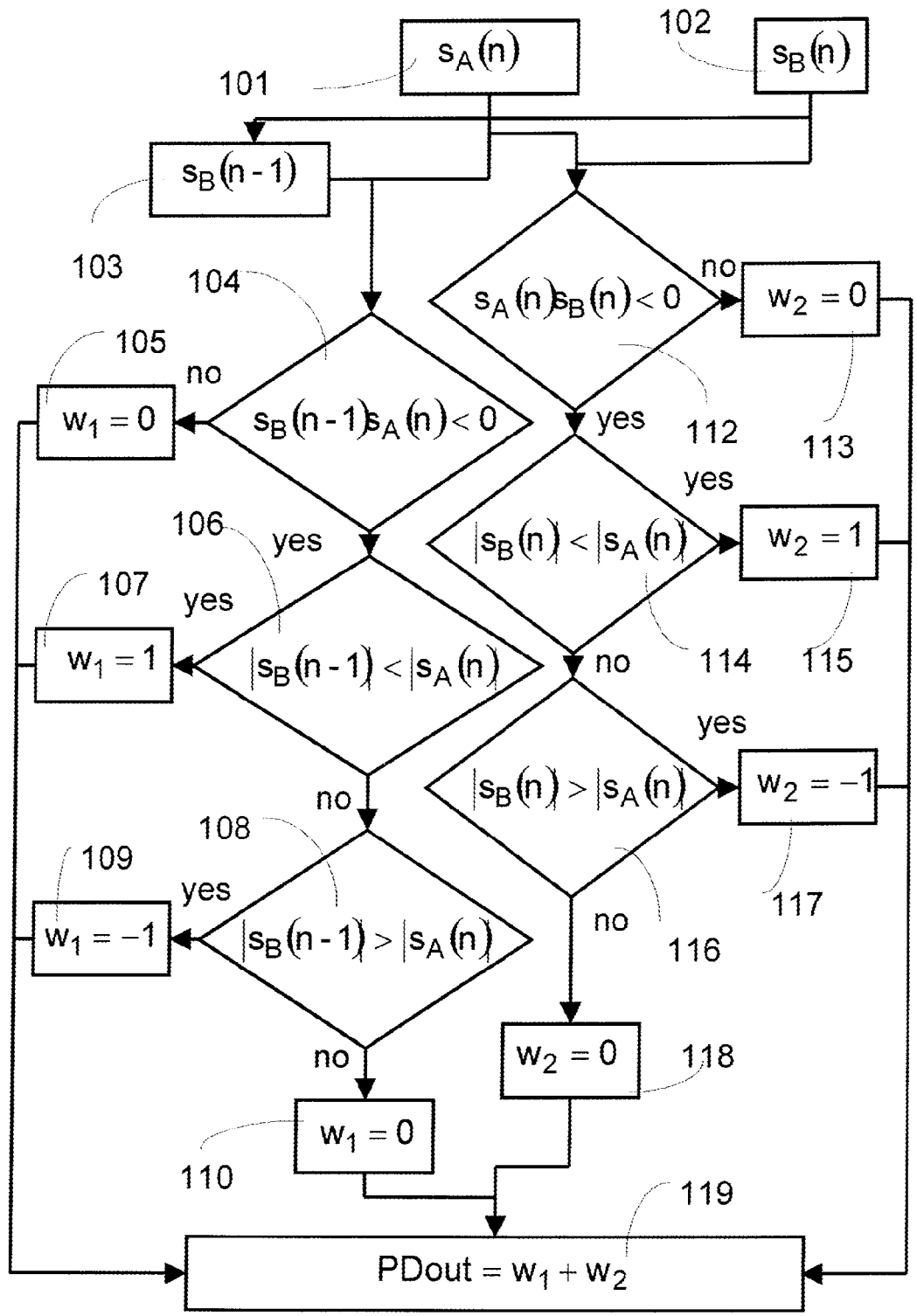
FIG. 10 shows a flow chart of a phase detection method of a second embodiment using un-quantized samples.

$w_1(n)$ and $w_2(n)$ are similar to $w_A(i)$ and $w_B(i)$. In order to clarify that $w_A(i)$ and $w_B(i)$ are computed from single samples whereas $w_1(n)$ and $w_2(n)$ are determined by transitions between neighboring samples we have chosen a slightly different notation. In FIG. 10, steps 101 and 102 illustrate inputting of A and B samples $s_A(n)$ and $s_B(n)$. Steps 104 to 110 illustrate equation (10). Step 103 illustrates the latching of the previous B sample $s_B(n-1)$. The previous B sample has been received between $(n-1)T$ and $nT$. On the other hand, steps 112 to 118 illustrate the calculation of the equation (11).

The phase detector output is defined by (12) illustrated by step 119:

$$PDout(n) = w_1(n) + w_2(n) \quad (12)$$

In connection with equation (12) we would like to note that is unlikely that both, $w_1(n)$ and $w_2(n)$ are non-zero. The case in which $w_1(n)$ and $w_2(n)$ are non-zero corresponds to the unlikely case $a=c\neq b$ in Alexander's clock recovery and data retiming circuit. In optical transmission systems the bandwidth is typically limited to about 0.75 times the symbol frequency, where 0.5 times the symbol frequency is necessary due to the Nyquist theorem. Noise rejection associated with this bandwidth limitation also helps to reduce the likelihood of the case in which both $w_1(n)$ and $w_2(n)$ are non-zero.

Third Embodiment

The third embodiment is a digital implementation of the second embodiment. Quantized sample $X=Q(s_\phi(n))$, $\phi \in \{A, B\}$ can take one of $2^q$ different values from 0 to $2^q-1$ (q-bit quantization, with unsigned arithmetic interpretation quantized values). We introduce two functions $P1(X)$ and $P2(X)$ of quantized sample X defined as:

$$P1(X) = \begin{cases} 0, & X < 2^{q-1} \\ 1, & X \geq 2^{q-1} \end{cases} \quad (13)$$

$$P2(X) = \begin{cases} 2^{q-1} - 1 - X, & X < 2^{q-1} \\ X - 2^{q-1}, & X \geq 2^{q-1} \end{cases} \quad (14)$$

One example for 3-bit quantization is given in table 201 shown in FIG. 11.

The result of the function P2 may be referred to as absolute sample value.

With respect to Gray coding, which has been explained above in connection with table one and to which we will revert in connection with FIG. 15 below, we would like to note that P1 and P2 constitute the most significant bit (MSB) and the least significant bits (LSBs) of Gray coded X. Assuming the zero value at the mid of full scale range of the ADC, P1 may be referred to as a sign function and P2 as an absolute value function.

Similar to the un-quantized version, the phase detector output is defined by equation (12). The weights are calculated from $$w_1(n) = \begin{cases} 1, & \text{if } P1(X) \neq P1(Y) \text{ and } P2(X) < P2(Y) \\ -1, & \text{if } P1(X) \neq P1(Y) \text{ and } P2(X) > P2(Y) \\ 0, & \text{otherwise} \end{cases} \quad (15)$$

$$w_2(n) = \begin{cases} 1, & \text{if } P1(Y) \neq P1(Z) \text{ and } P2(Z) < P2(Y) \\ -1, & \text{if } P1(Y) \neq P1(Z) \text{ and } P2(Z) > P2(Y) \\ 0, & \text{otherwise} \end{cases} \quad (16)$$

where X, Y, Z denote $Q[s_B(n-1)]$, $Q[s_A(n)]$ and $Q[s_B(n)]$, respectively.

Figure 12:
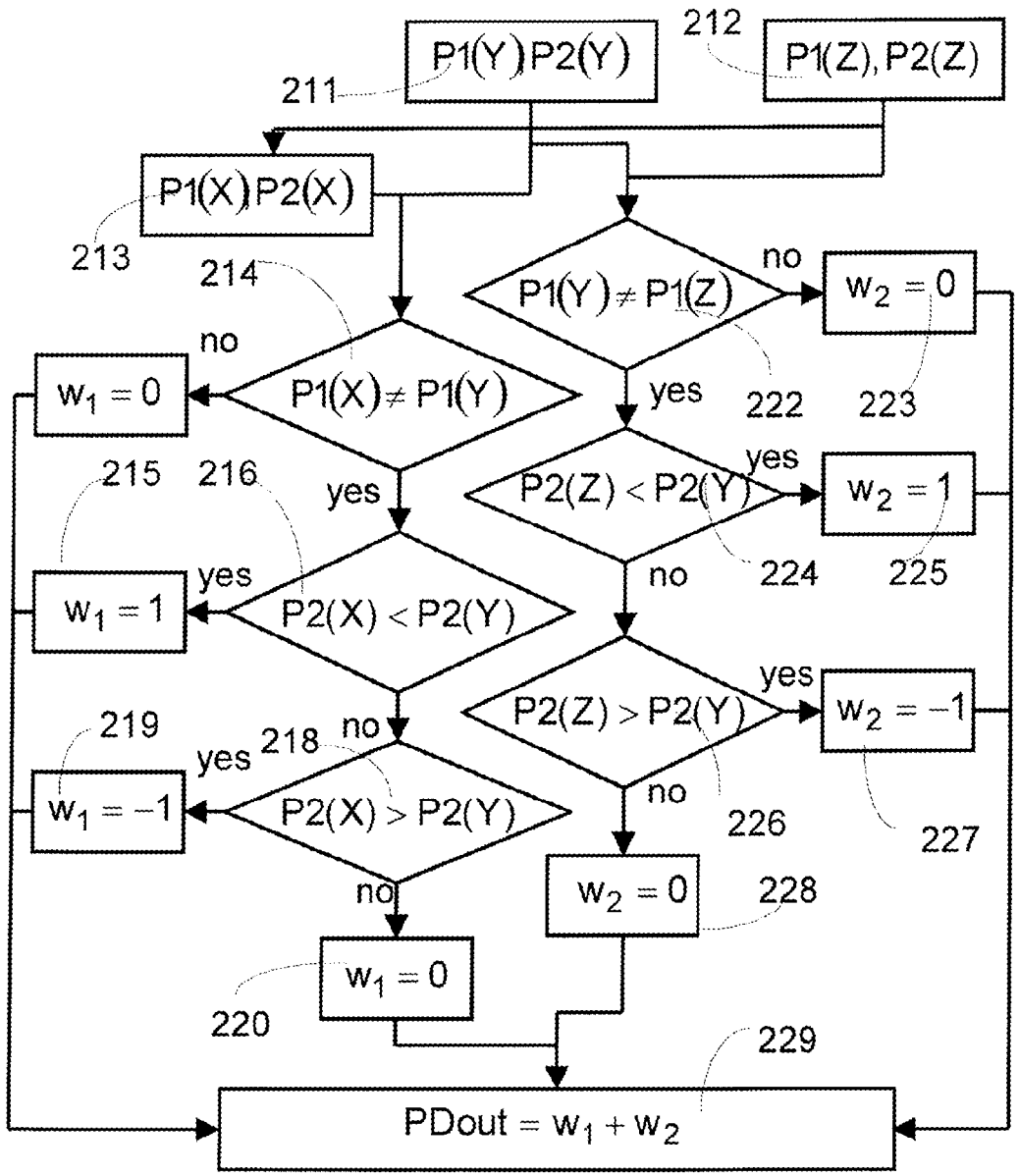
FIG. 12 shows a flow chart of a digital phase detection method of the third embodiment.

The third embodiment is illustrated by the flowchart in FIG. 12. FIG. 12 is similar to FIG. 10 and similar steps all labeled by numbers that are by 110 higher in FIG. 12 than in FIG. 10. For example, step 213 illustrates the latching of the previous B sample which is equivalent to latching the results of functions P1 and P2. Steps 214 to 220 illustrate the calculation of equation (15). Steps 222 to 228 illustrate the calculation of equation (16).

The applicant's internal reference for the second and third embodiments is PD53.

Fourth Embodiment

Although the three embodiments described above are designed for two-fold oversampling, this is not a necessary feature. Rather, the absolute value |s| in an un-quantized version of the fourth embodiment, or $P2(Q(s))$ in a quantized version of the fourth embodiment, can be used to find the maximum eye-opening of a received data signal. The clock frequency in this fourth embodiment is either increased or decreased between two sampling instants. If the clock frequency is increased between $s((n-1)T+\tau_{n-1})$ and $s((n)T+\tau_n)$ and $|s((n-1)T+\tau_{n-1})|<|s((n)T+\tau_n)|$, the clock frequency is further increased, because this seems to be the right direction to go. On the other hand, if $|s((n-1)T+\tau_{n-1})|>|s((n)T+\tau_n)|$ the clock frequency is decreased, because increasing seems to be the wrong direction.

If the clock frequency is decreased between $s((n-1)T+\tau_{n-1})$ and $s((n)T+\tau_n)$ and $|s((n-1)T+\tau_{n-1})|<|s((n)T+\tau_n)|$, the clock frequency is further decreased. On the other hand, if $|s((n-1)T+\tau_{n-1})|>|s((n)T+\tau_n)|$ the clock frequency is increased.

If $|s((n-1)T+\tau_{n-1})|=|s((n)T+\tau_n)|$ the clock frequency can arbitrarily be increased or decreased for example by a small constant frequency difference. Alternatively the previous frequency step could be repeated by applying the same frequency difference again.

The absolute value of the frequency difference can be chosen to be proportional to $\||s((n-1)T+\tau_{n-1})|-|s((n)T+\tau_n)|\|$, if this value is different from zero.

In a quantized fourth embodiment, s(t) is replaced by Q(s(t)).

Clock frequencies are often generated by VCOs. Due to the nonlinear characteristic of a VCO, the same voltage difference does not necessarily result in the same frequency difference. Therefore, in a modification of the fourth embodiment, frequency differences may be replaced by voltage differences in the description of the fourth embodiment above.

Additional conditions could be inserted in the fourth embodiment. The clock could e.g. only be changed if a sequence of . . . 010 . . . or . . . 101 . . . is detected. These sequences represent the eye opening for weakly distorted signals. In other case, data selectivity e.g. on " . . . 0011 . . . " or on " . . . 1100 . . . " might be useful. This selectivity idea is more specific than the "transition search-and-classify" picture discussed in the context of the first embodiment. Actually, the selectivity idea is not limited to the fourth embodiment, but may also be applied to the other embodiments, in particular, the first, third and fifth embodiment.

The fourth embodiment can be implemented in a simple manner for binary symbol transmission. The implementation becomes more complicated if multi-level modulation is used with two or more eye-openings during each symbol period.

Fifth Embodiment

The fifth embodiment is similar to the third embodiment. The main difference is the way the samples X, Y and Z that are used by the phase detector are obtained from the data samples, namely by interpolation. Notably, the use of interpolated values effectively leads to a sampling phase shift of T/4 against the sampling phase of the third embodiment. Skilled practitioners will appreciate that the concept of feeding a phase detector with interpolated values can be used with other embodiments as well.

Again, FIG. 1 illustrates double oversampling of an electrical, DC-free signal. For explaining the fifth embodiment, we refer to the four un-quantized samples $s_A(n-1)$, $s_B(n-1)$, $s_A(n)$ and $s_B(n)$ sampled during the $(n-1)^{th}$ and $n^{th}$ time slot. These un-quantized samples are sampled and quantized e.g. by a flash ADC comprising a quantizer 301 and a sampling circuit 302. The respective quantized samples are referred to as $Q(s_A(n-1))$, $Q(s_B(n-1))$, $Q(s_A(n))$ and $Q(s_B(n))$. Quantized samples $Q(s_A(n-1))$, $Q(s_B(n-1))$, $Q(s_A(n))$ and $Q(s_B(n))$ can take one of $2^q$ different, unsigned values from 1 to $2^q$ (q-bit quantization). In accordance with the fifth embodiment quantized, signed samples X, Y and Z are obtained by (cf. FIG. 14):

$$X=Q[s_A(n-1)]+Q[s_B(n-1)]-(2^q+1) \quad (17)$$

$$Y=Q[s_B(n-1)]+Q[s_A(n)]-(2^q+1) \quad (18)$$

$$Z=Q[s_A(n)]+Q[s_B(n)]-(2^q+1) \quad (19)$$

In this embodiment the quantized samples X, Y and Z are referred to as "interpolated samples". These interpolated samples are obtained by summing neighboring samples and subtracting offset $2^q+1$ for unsigned to signed conversion.

Mathematically this corresponds to scaled interpolation in the middle between pairs of neighboring original samples, $Q(s_A(n-1))$, $Q(s_B(n-1))$, $Q(s_A(n))$ and $Q(s_B(n))$. In other words, the interpolated samples are obtained essentially by linear interpolation between two neighboring original samples, or by averaging two neighboring original samples.

Apparently, interpolated samples can take one of $2^{q+1}-1$ different values. Let us introduce functions P1 and P2 in a similar way as done the third embodiment. The functions P1 and P2 may be implemented by look-up table 251 in FIG. 13. Again, P1 is similar to a sign function and P2 returns the absolute value of the argument X as defined in a more general manner by:

$$P1(X) = \begin{cases} 0, & X < 0 \\ 1, & X = 0 \\ 2, & X > 0 \end{cases} \quad (20)$$

$$P2(X) = \begin{cases} X, & X \geq 0 \\ -X, & X < 0 \end{cases} \quad (21)$$

In an alternate embodiment, the offset $2^q+1$ in equations (17) to (19) may be allowed for by a different look-up table as described in the context of the third embodiment, FIG. 11.

The output of the phase detector PDout is calculated from equations (12), (15) and (16) again.

If the quantizing function Q is omitted or replaced by a linear function, one may obtain an un-quantized phase detector, which may be regarded as a hybrid of the second and fifth embodiment.

In all embodiments PDout is described as a dimensionless quantity. For actually controlling a VCO, PDout must be converted to a control voltage $U_{ref}$. The voltage $U_{ref}$ depends on the clock recovery design, especially on the selected VCO. The analog conversion may be non-linear, which means that $U_{ref}$ is a function of Pdout, e.g. for linearizing the VCO characteristic or optimizing another performance parameter.

The applicant's internal reference of the fifth embodiment is PD54.

Simulation Results

To show the robustness of the proposed synchronizer we have simulated a variety of optical channels disturbed by noise, chromatic dispersion (CHD) and polarization mode dispersion (PMD).

The simulation space in FIGS. 3 to 6 was:
OSNR was changed from 10 to 20 dB in steps of 2 dB,
residual chromatic dispersion (RD) was varied from 0 to 4000 ps/nm in steps of 100 ps/nm,
differential group delay (DGD) was taken from 10 to 100 ps in steps of 10 ps,
The PMD power coupling factor (PCF) was set to 0.5 and for calculation of the timing error variance pursuant to the linearized model according to Meyr two values of one-sided loop bandwidth have been used: 1 and 10 MHz.

The simulation data shown in FIGS. 3 to 6 have been obtained for the first embodiment using a NRZ (non-return to zero) modulation format. For the third embodiment similar simulation data exist which, however, have not been included in to this application. Despite of variations in details, the characteristics of the first and third embodiments are similar on the whole.

For simulation purposes we have defined the timing function or the timing error detector characteristic (TEDC) which is defined as the expected value of the phase detector output PDout at a given phase $2\pi\tau/T$. At this point it may be helpful to remember that PDout(n) also depends on $\tau$, although this is normally not explicitly indicated in the notation.

$$TEDC(\tau)=\overline{PDout(n,\tau)} \quad (22)$$

The timing function TEDC is a periodical function of period T. In order to be useful for phase adjustment, TEDC should fulfill some conditions as:
- existence of only one equilibrium point, which corresponds to the zero crossing of the TEDC having positive slope,
- TEDC slope at the equilibrium point should be large enough to provide good locking and tracking performance,
- the maximum value of the TEDC must not be severely decreased by increasing channel distortion and
- the timing function should be DC-free
- TEDC symmetry in a sufficient large interval around the equilibrium point.

Figure 2:
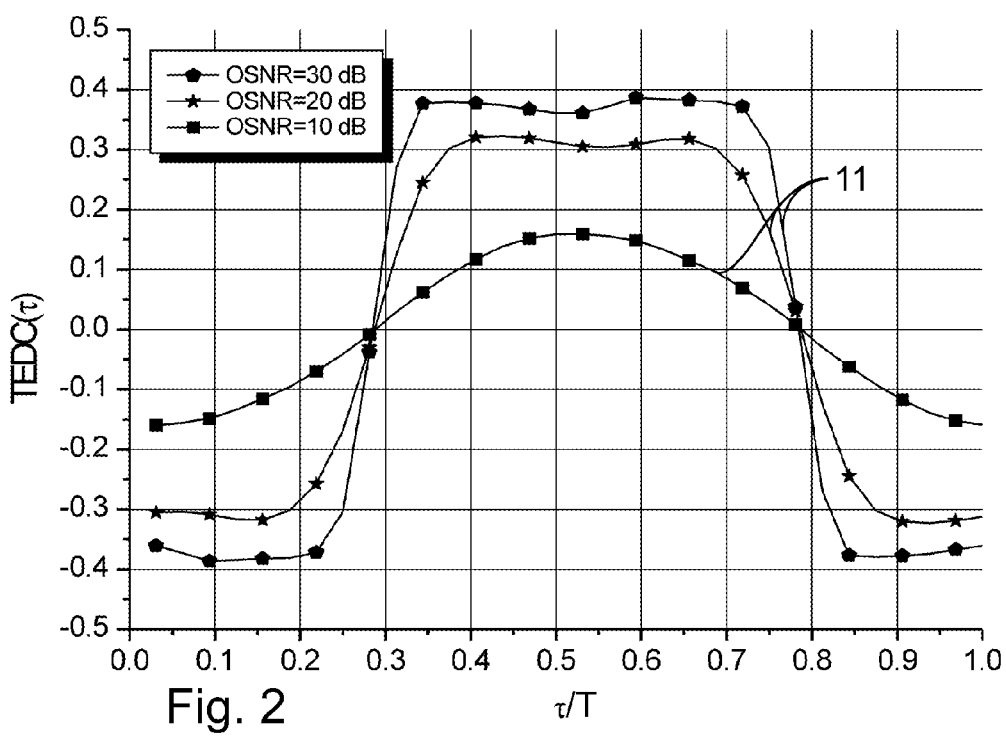
FIG. 2 shows timing functions (TEDC) of the first embodiment on optical channels with different noise levels.

For the first embodiment of a phase detector, we present TEDC's of some optical channels disturbed by noise in FIG. 2. FIG. 2 illustrates some advantages of the proposed phase detector TEDC:
- existence of one equilibrium point,
- TEDC slope at the equilibrium point is not seriously decreased by decreasing optical signal-to-noise ratio (OSNR) and
- OSNR decrease from 30 dB to 10 dB lowers the TEDC maximum for only 60% and
- TEDC has good symmetry.
- TEDC is DC-free In the third embodiment, OSNR decrease from 30 dB to 10 dB lowers the TEDC maximum for only 47%. The TEDC characteristic of the third embodiment is nearly symmetrical to a vertical line at $0.5=\tau/T$, whereas in FIG. 2 deviations from the symmetry are clearly visible.

Figure 3:
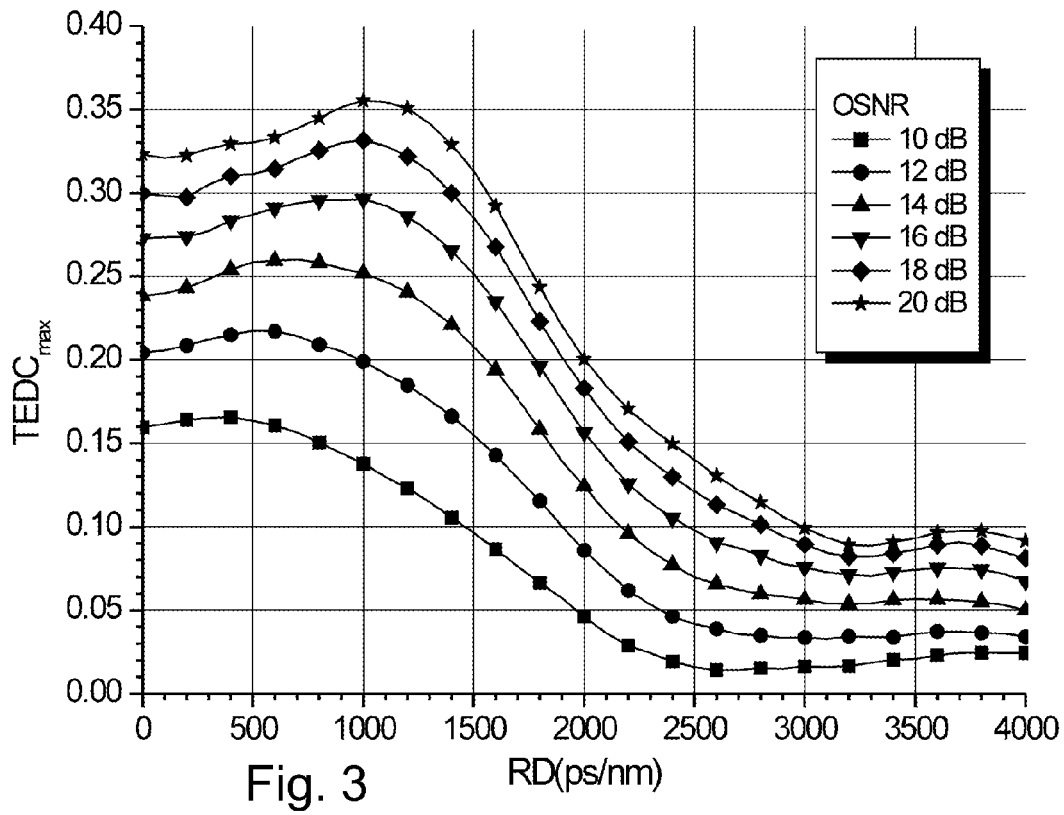
FIG. 3 shows maxima of timing functions (TEDCs) of the first embodiment on optical channels in presence of RD.
Figure 4:
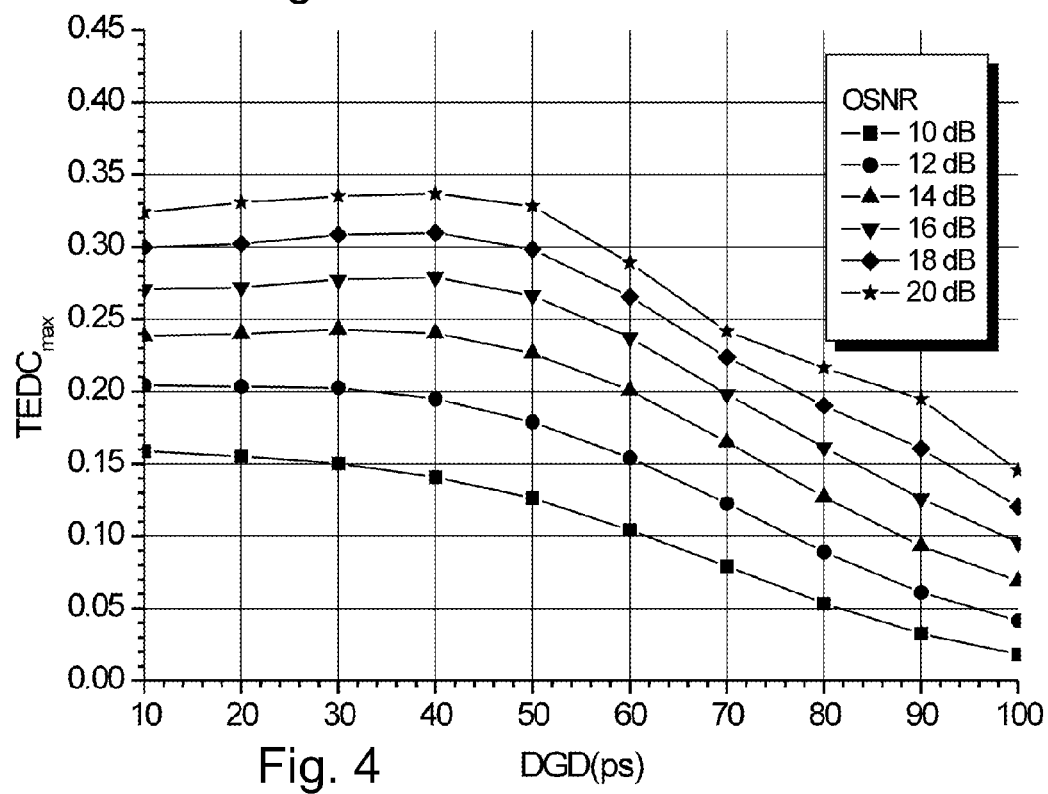
FIG. 4 shows maxima of timing functions (TEDCs) of the first embodiment on optical channels in presence of first order PMD.
Figure 5:
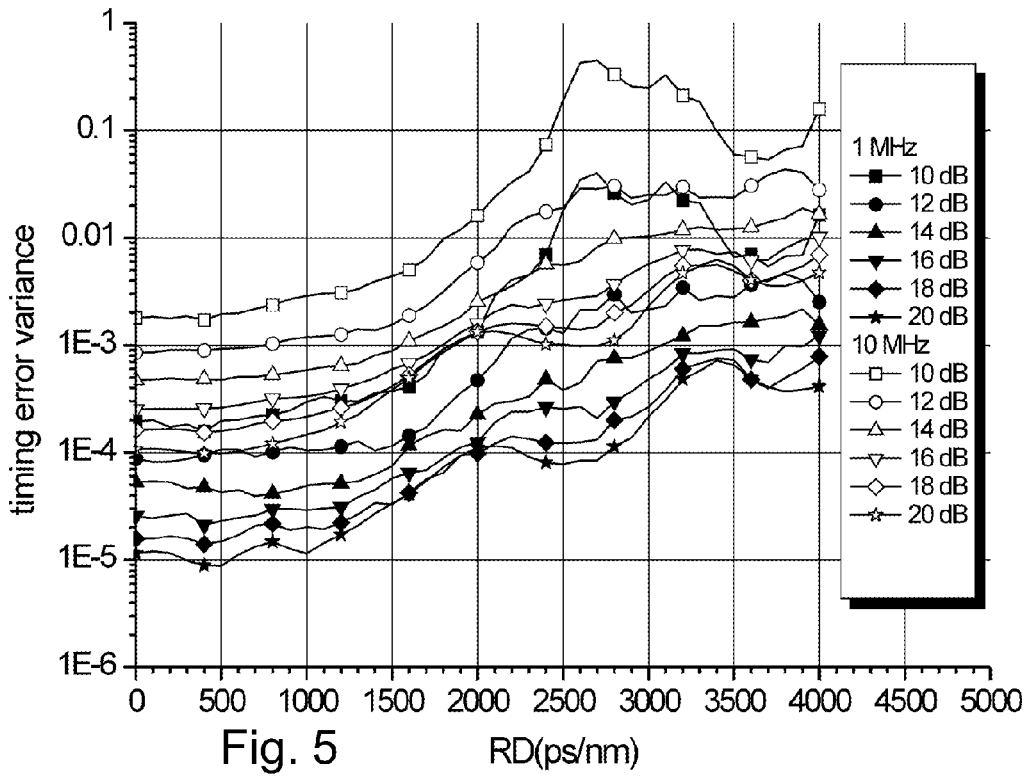
FIG. 5 shows timing error variances of the first embodiment on optical channels in presence of RD.
Figure 6:
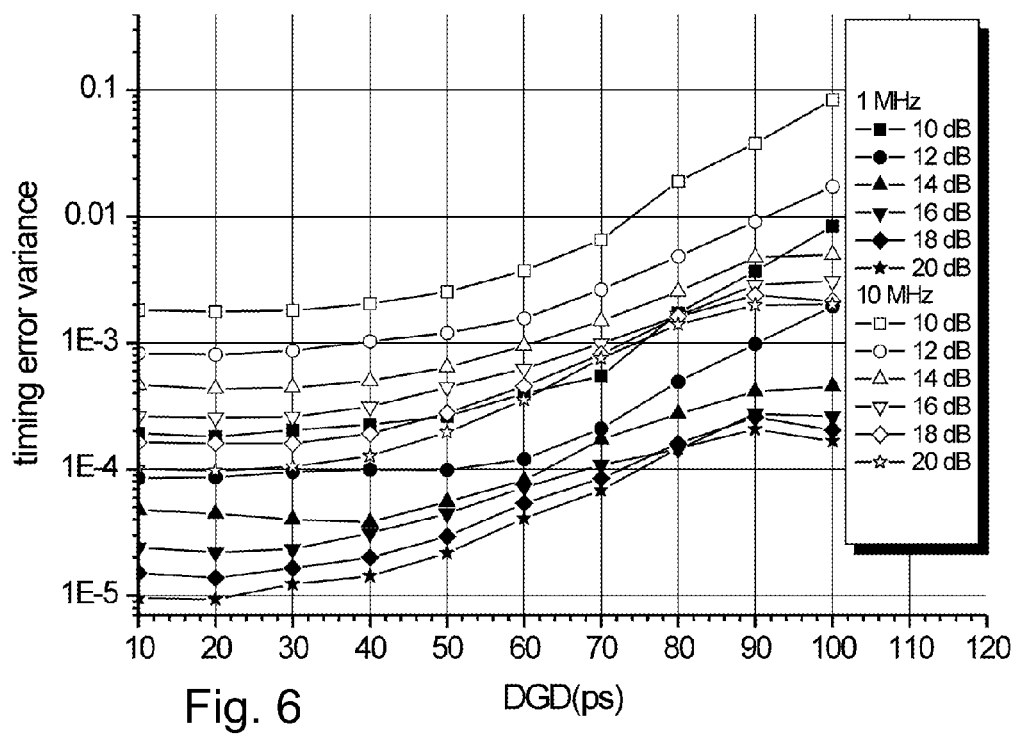
FIG. 6 shows timing error variances of the first embodiment on optical channels in presence of PMD.

Reference numeral 11 designates maxima of the TEDC that are plotted on the ordinate in FIGS. 3 and 4.

The TEDC maximum values are presented in FIGS. 3 and 4 for CHD and PMD, respectively.

Timing error variance is estimated at the equilibrium point of the synchronizer. Results are presented in FIGS. 5 and 6.

Simulation results show that:
- none of simulated channels has more than one equilibrium point (not visible in figures),
- TEDC maxima of most distorted channels with OSNR greater or equal to 14 dB are large enough to provide good locking performance,
- the timing error variance performance indicates that using reasonable loop bandwidth the effect of loop noise on the timing error can be reduced to fulfill jitter tolerance constraints. This means that the synchronizer, beside good locking performance, also provides good tracking performance and
- TEDC is symmetrical and DC free for all simulated channels.

For the third embodiment, the simulation results show that the performance is nearly independent of the signal strength $U_{AGC}$ defined in equation (23). The simulation has been performed for $U_{AGC}$ of 1.75, 2.45 and 3.5 times the height of a quantization step. This result can be explained with reference to equations (10), (11), (15) and (16). The weights are independent of the amplitude of signal s(t) and hence independent of the signal strength $U_{AGC}$. Only in the quantized case, the desired phase detector output may vanish, i.e. P2(X) and P2(Y) may be equal for some $U_{AGC}$ ranges, resulting in a $w_1$ of 0, and may be unequal for other $U_{AGC}$ ranges, resulting in a $w_1$ of $\pm 1$ for the same signal before the AGC gs(t). Consequently, to obtain a useful phase error signal in the quantized case $U_{ACG}$ must not be too small in order to obtain the desired clock frequency. However, unlike in the first embodiment, an inappropriate choice of $U_{AGC}$ will at least not invert the timing error output of the phase detector, due to the different signs of $w_{A1}$ and $w_{A2}$ as well as $w_{B1}$ and $w_{B2}$ in the first embodiment.

To show robustness of the fifth embodiment of the phase detector, we have simulated a variety of optical channels disturbed by noise, chromatic dispersion (CHD) and polarization mode dispersion (PMD).

Simulation space was:
- OSNR was changed from 10 to 20 dB in step of 2 dB,
- residual chromatic dispersion (RCHD) was varied from 0 to 4000 ps/nm in step of 100 ps/nm,
- differential group delay (DGD) was taken from 10 to 100 ps in step of 10 ps,
- power coupling factor (PCF) was varied from 0.1 to 0.9 in step of 0.1,
- simulation was done for signal strength $U_{AGC}$=0.30, 0.35 and 0.40,
- for the calculation of the timing error deviation the values of one-sided loop bandwidth (LBW) was set to 4 MHz; one-sided loop bandwidth is defined as $$LBW = \int_0^\infty |H(\omega)|^2 \frac{d\omega}{2\pi},$$

wherein $H(\omega)$ is the PLL transfer function.
$U_{ref}$ was set to 1, and
transmission speed was 10.7 GHz.

The phase detector is quite robust against signal strength variation.

Simulations done for the fifth embodiment have revealed the following:
- existence of one equilibrium point,
- TEDC slope at the equilibrium point is not seriously degraded by decreasing optical signal-to-noise ratio (OSNR),
- TEDC is symmetrical and
- TEDC is DC free.
- TEDC maxima of the most distorted channels with OSNR greater or equal to 12 dB are high enough to provide good looking performance,
- timing error variance performance indicates that the effect of loop noise on the timing error can be reduced to fulfill jitter tolerance constraints provided that a reasonable one-sided loop bandwidth is used; this means that the synchronizer, beside good locking performance, also provides good tracking performance and
- none of simulated channels has more than one equilibrium point; all TEDC's are symmetrical and DC-free A feature of this phase detector embodiment is that the equilibrium point of sample A is always placed in the center of the eye diagram. It is well known that this sampling point produces the best BER performance in systems using one sample per bit.

Implementation

Figure 7:
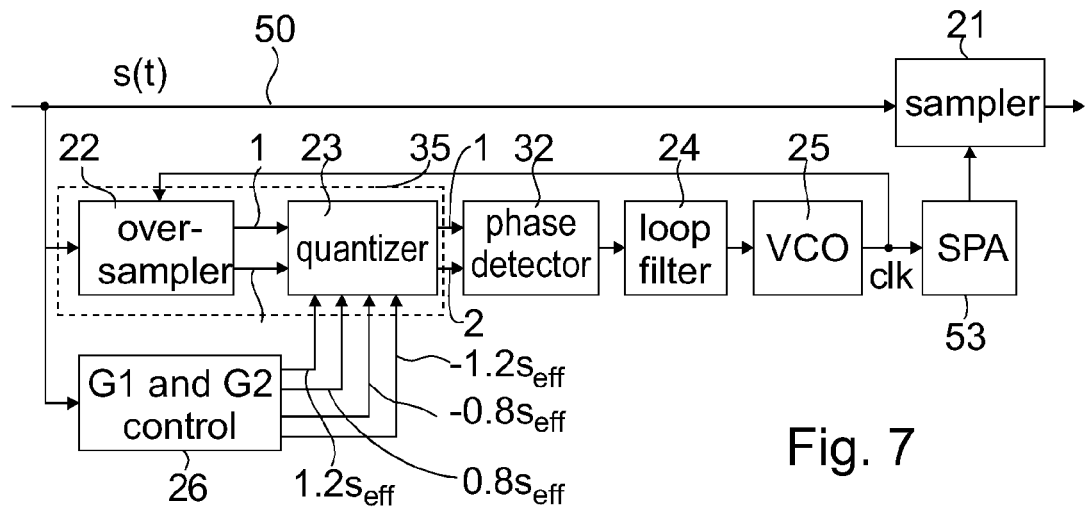
FIG. 7 shows a synchronizer block diagram of an embodiment using two samplers, one for the phase detector and one for data detection, with optional sampling phase adjustment.
Figure 15:
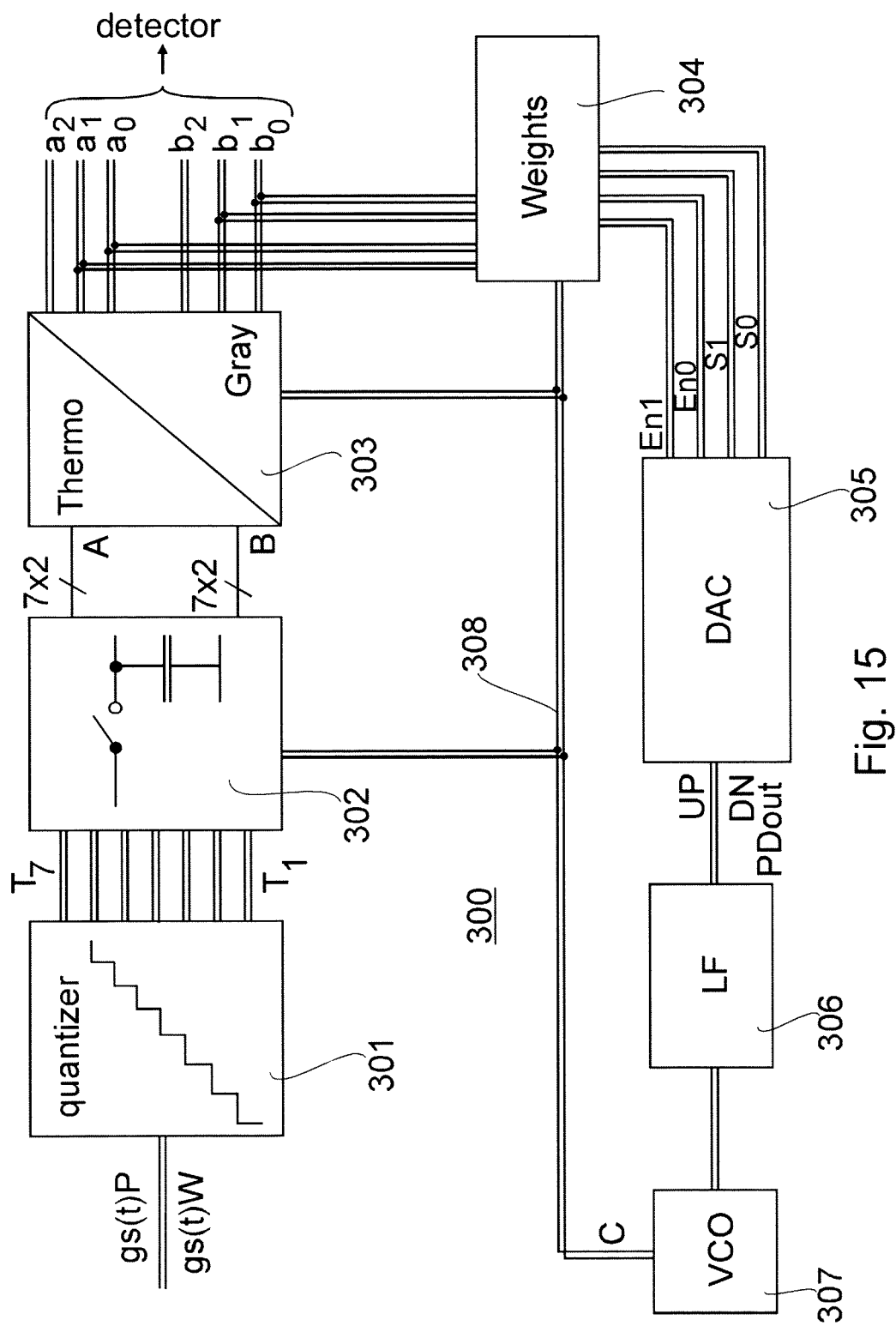
FIG. 15 shows a circuit diagram of a flash clock synchronizer comprising a flash ADC for 2-fold oversampling implementing the first embodiment.

In the following several embodiments of the synchronizer will be discussed:

in systems using separate, and possibly different, ADCs for data detection and for phase detector input generation, as shown in FIG. 7 and in systems using a single ADC both for data detection and for phase detector input generation, as shown in FIG. 8 and FIG. 15.

Systems of the first type, with separate signal paths for clock recovery and for data detection, are slightly more complex but, as an advantage, allow sampling phase adjustment in the data path independent of the recovered clock phase.

FIG. 7 shows an embodiment of such a system with independent signal paths. The system comprises a data path with a sampler 21, which produces e.g. one output per symbol. The output of sampler 21 is provided to a quantizer for detecting and decoding the transmitted symbols in downstream functions.

Figure 9:
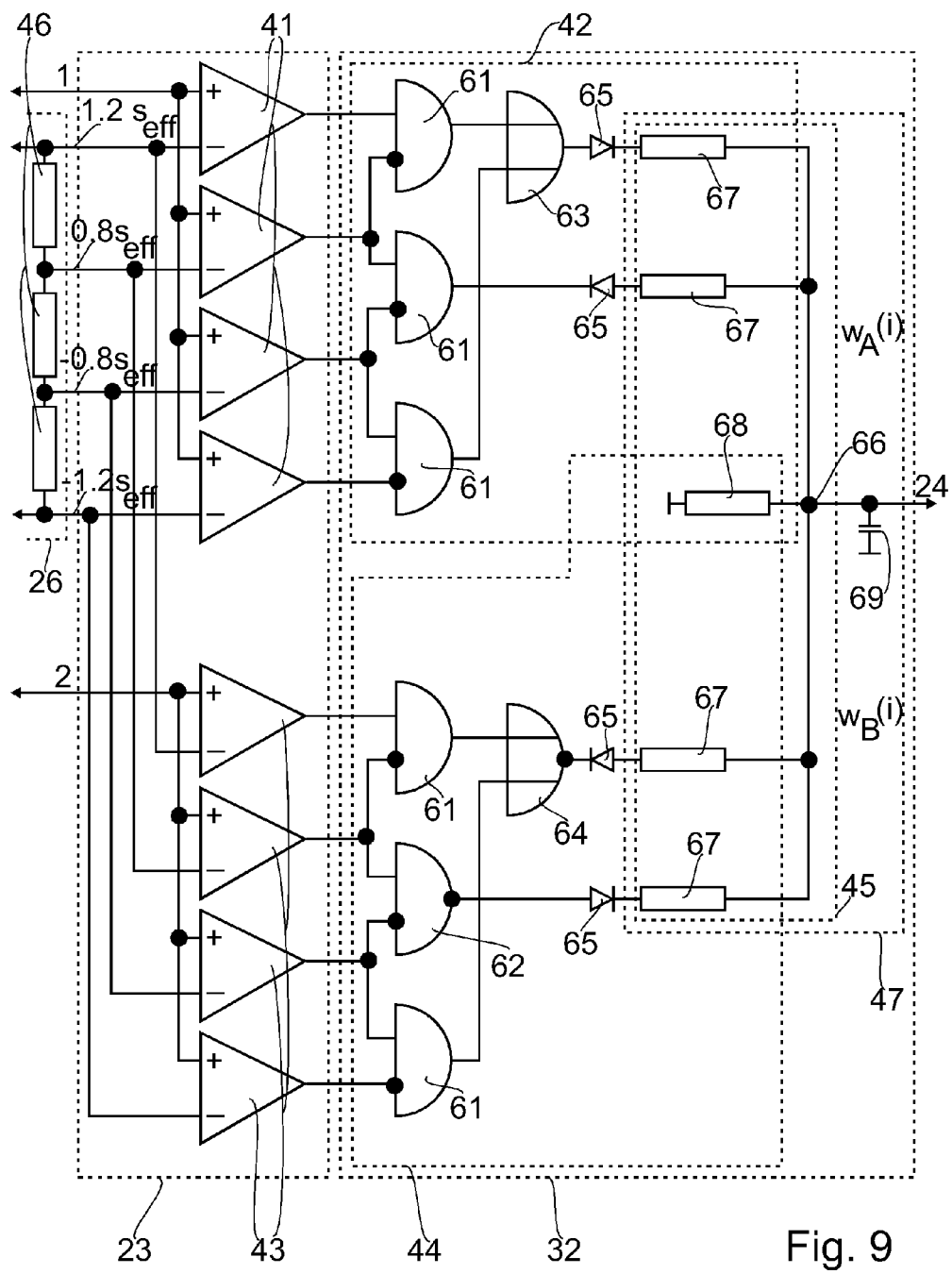
FIG. 9 shows a schematic circuit diagram of a quantizer and phase detector in accordance with the first embodiment, which uses a separate signal path and a dedicated ADC for the phase detector.

The second branch starting at oversampler 22 regenerates the clock and controls the sampling phase in the data path 50. Oversampler 22, together with quantizer 23, forms a specialized non-uniform ADC 35, which generates two quantized, thermometer-coded samples per symbol interval T, as illustrated by two output lines designated 1 and 2 for A and B samples, respectively. These samples are fed into phase detector 32. An embodiment of quantizer 23 and phase detector 32 is shown in FIG. 9. Phase detector 32 provides its output to loop filter 24 and voltage-controlled oscillator 25. Voltage-controlled oscillator 25 regenerates a clock clk having a fixed phase relation to the electrical signal s(t). The regenerated clock clk is returned to oversampler 22 and forwarded to SPA 53, which can be used to calibrate or even dynamically optimize the data sampling phase in sampler 21, with respect to any suitable performance criterion. Threshold control 26 measures some kind of signal strength and generates thresholds $G_1$ and $G_2$. The signal strength may be the mean rectified value $|\bar{s}|$ calculated according to equation (9), or equation (23) if the signal is not DC free.

A simple implementation of a system using only a single ADC is shown in FIG. 8. In this arrangement, no additional sampling phase adjustment is possible; this is adequate to the extent that systems that employ oversampling are often quite insensitive to sampling phase variation. Oversampler 22 receives its input from AGC 51 and generates an A and B sample for each symbol comprised in electrical signal s(t) 50. This is illustrated by two output lines designated 1 and 2. The A and B samples are input into quantizer 31, which outputs quantized samples qs. Oversampler 22 and quantizer 31 together are referred to as ADC 35. The quantized samples comprise A and B samples which are input into phase detector 32. The output of phase detector 32 is filtered by loop filter 33 and provided to voltage-controlled oscillator 34 which provides the sampling clock to oversampler 22.

In the embodiment of FIG. 8 the variable gain AGC is controlled in such a way that the signal strength $U_{AGC}$ (mean rectified value) of the gain controlled waveform gs(t) remains approximately constant and equal to an AGC reference value $U_{AGC,ref}$:

$$U_{AGC} = \overline{|s(t) - \overline{s(t)}|} \quad (23)$$

Consequently it is not necessary to calculate the mean rectified value of the quantized samples, rather a weighting value may be associated to each predetermined set of quantized values. The sets of quantized values are separated by thresholds 3 and 4 as explained in connection with FIG. 1.

In an alternate embodiment an approximation of the mean rectified value may be calculated from the quantized samples qs in order to calculate thresholds 3 and 4 by dedicated logic.

Since phase detector 32 receives digital input, phase detector 32 and loop filter 33 may be implemented by dedicated logic for high-speed applications. In an alternate embodiment, phase detector 32 and loop filter 33 may be realized by general-purpose logic controlled by a suitable software in order to implement equations (3) to (7) as far as applicable.

Moreover, the phase detector 32 can really be integrated into an existing ADC, in particular into its quantizer part. Often an ADC has a resolution of three or more bits, which implies seven or more thresholds. The desired subset of e.g. four thresholds required for the phase detector can be tapped at a suitable point in the quantizer and used in the phase detector output generation logic, as shown in FIG. 15.

It is noted that other implementations are possible. In particular in high-speed systems so-called flash ADCs are used, which comprise parallel threshold detectors. In this case the sampling is done by periodically reading the results of a quantizer. Therefore, in this implementation, the quantizer is followed by a sampler.

The thermometer code generated by a flash ADC may be converted into a 1-of-$2^q$ enumeration code which is then gray or binary coded. At each of the coder stages, the phase detector logic can be applied just by tapping into the digitized values.

Especially in a flash ADC, the phase detector logic that generates the phase detector output could just tap into the ADC internal signals.

FIG. 9 shows an embodiment of quantizer 23 and a phase detector 32 together with parts of threshold control 26. Quantizer 23 and a phase detector 32 constitute an implementation of equations (3) to (5) or (3), (6) and (7).

Resistors 46 are considered to form part of threshold control 26. Resistors 46 generate the four thresholds $G_2=1.2|\bar{s}|$, $G_1=0.8|\bar{s}|$, $-G_1$ and $-G_2$ for the two sets of comparators 41 and 43. First set of operators 41 receives A samples 1 whereas second set of operators 43 receives B samples 2.

Assignment circuit 42 assigns assignment values $w_{A,i}$ to A samples whereas assignment circuit 44 assigns assignment values $w_{B,i}$ to B samples. AND gates 61, NAND gate 62, OR gate 63, NOR gate 64 and diodes 65 constitute logic circuitry within assignment circuits 42 and 44. Dots at inputs or outputs of gates designate inversions. Resistors 67 and 68 form adder 45. The ratios of the resistors 67 and 68 determine the weighting values. The impedance of resistors 67 and 68 and diodes 65 at note 66 together with capacitance 69 form a simple low pass filter 47. A timing error signal representing a noisy version of a TEDC timing function discussed above is generated at node 66 and output towards loop filter 24.

FIG. 15 shows an overview circuit diagram of a flash clock synchronizer 300. It implements the first embodiment illustrated by FIG. 1 and defined by equations (1) to (5). This flash clock synchronizer is specifically designed for high-speed applications. To this end a flash analog-to-digital (ADC) converter is provided, which comprises a quantizer 301, which is explained in more detail in FIG. 16, and a sampling circuit 302.

Due to the high frequencies, most components of the flash clock synchronizer are designed symmetrically. This basically means that every signal is transported via a positive and a negative line. The positive line carries the signal itself, whereas the negative line carries the inverted signal. When it is important to distinguish between the positive and negative line, "P" and "N" are appended to the designation of the signal. For example, the gain controlled analog signal gs(t) is provided via positive line gs(t)P and negative line gs(t)N to the quantizer 301.

The output of quantizer is 301 is provided via seven line pairs to a sampling circuit 302 which comprises seven samplers 321 which are explained in more detail in connection with FIG. 17. The output of quantizer 301 is thermo-coded and so is the output of sampling circuit 302. Sampling circuit 302 provides A samples A and B samples on seven line pairs each to thermo-to-Gray code converter 303.

The thermo-to-Gray code converter 303 encodes A and B samples into three bits each. Symbols $a_2$, $a_1$ and $a_0$ designate the three bits of the A samples, and $b_2$, $b_1$ and $b_0$ designate the three bits of the B samples. Symbols $a_2$ and $b_2$ designate the most significant bits (MSBs), and $a_0$ and $b_0$ designate the least significant bits (LSBs). The Gray-coded samples are provided to a detector for recovering the transmitted data. In addition, the least significant bits $a_0$, $a_1$, $b_0$ and $b_1$ are inputted into weighting circuit 304. The least significant bits of each sample constitute the absolute value of the difference of each sample minus the average of a plurality of samples.

The weighting circuit 304 assigns weights $w_A(n)$ and $w_B(n)$ and already calculates PDout(n). By assigning proper weights, the weighting circuit 304 implicitly performs the comparison with thresholds $G_1$ and $G_2$. The weighting circuit 304 provides its output via four line pairs to digital-to-analog converter 305. The output of digital-to-analog converter 305 is low-pass filtered in a loop filter 306 and controls the frequency of VCO 307.

The VCO 307 provides a synchronized clock to the sampling circuit 302, to the thermo-to-Gray converter 303 and to weighting circuit 304.

The flash clock synchronizer is operated at a voltage of 3.3V.

Figure 16:
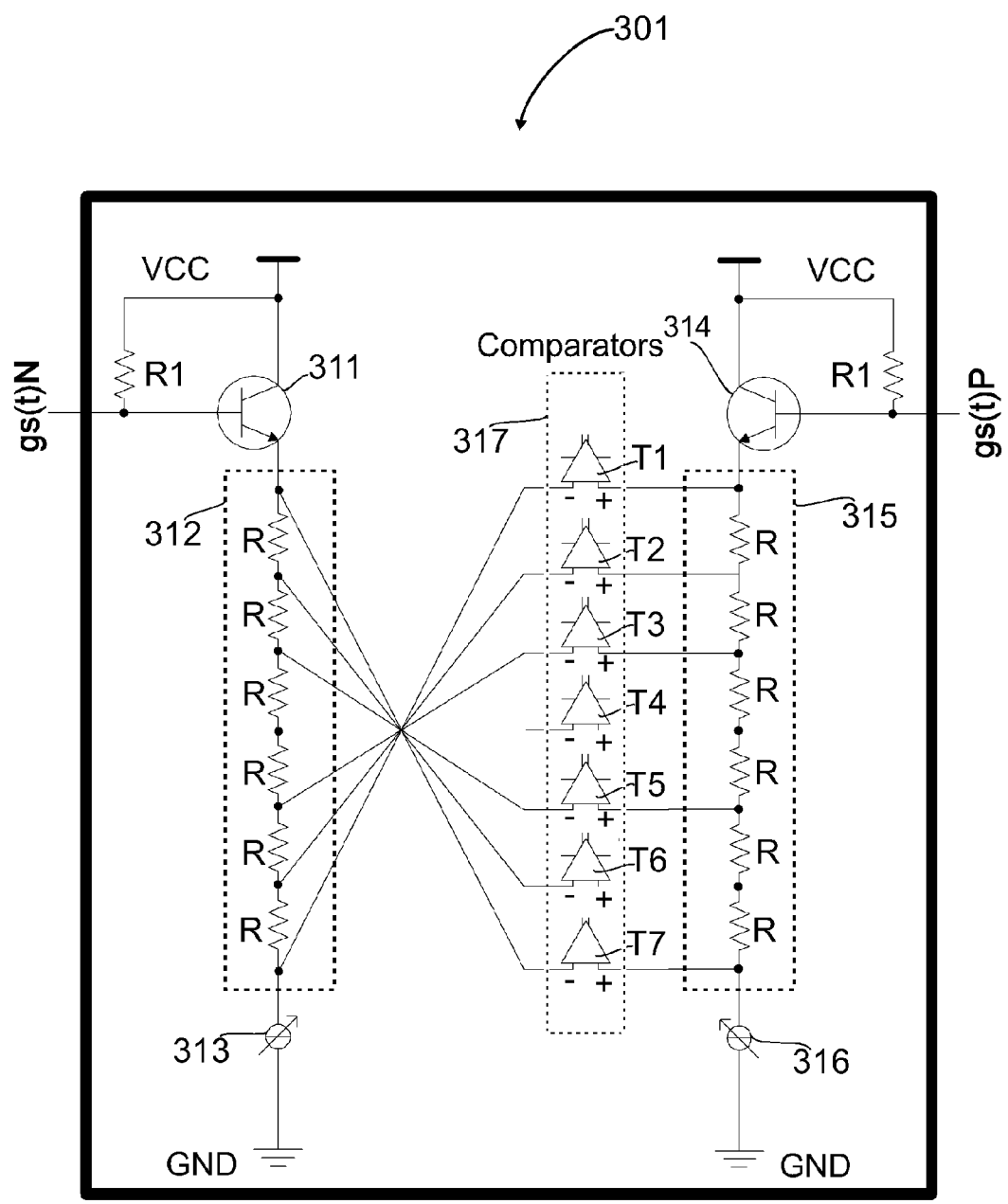
FIG. 16 shows an embodiment of a quantizer comprised in the flash clock synchronizer of FIG. 15.

FIG. 16 shows quantizer 301 in more detail. The analog gain controlled signal gs(t) is provided symmetrically to transistors 311 and 314.

From the positive and negative input signals gs(t)P and gs(t)N constant voltage steps are subtracted by voltage dividers 312 and 315 and current sources 313 and 316. Thereby seven voltage levels are generated for each input signals gs(t)P and gs(t)N. The seven voltage levels of each input signal are compared with each other by comparators 317. More specifically the highest voltage level based on positive input signal is compared by comparator T1 with the lowest voltage level based on the negative input signal and so on. The resulting output signal is a thermo code. This means that the output bits having a small index output a logic 1 and the output bits having a large index output 0. The boundary between 1s and 0s indicates the level of the input signal. For very high and low input signals all output bits may become 1 or 0, respectively.

In another embodiment the voltage dividers 312 and 315 may comprise resistors having a different resistance which results in a non-linear characteristic of the quantizer in order to compensate for a non-linear characteristic of the transmission channel and/or the optical-to-electrical converter.

Figure 17:
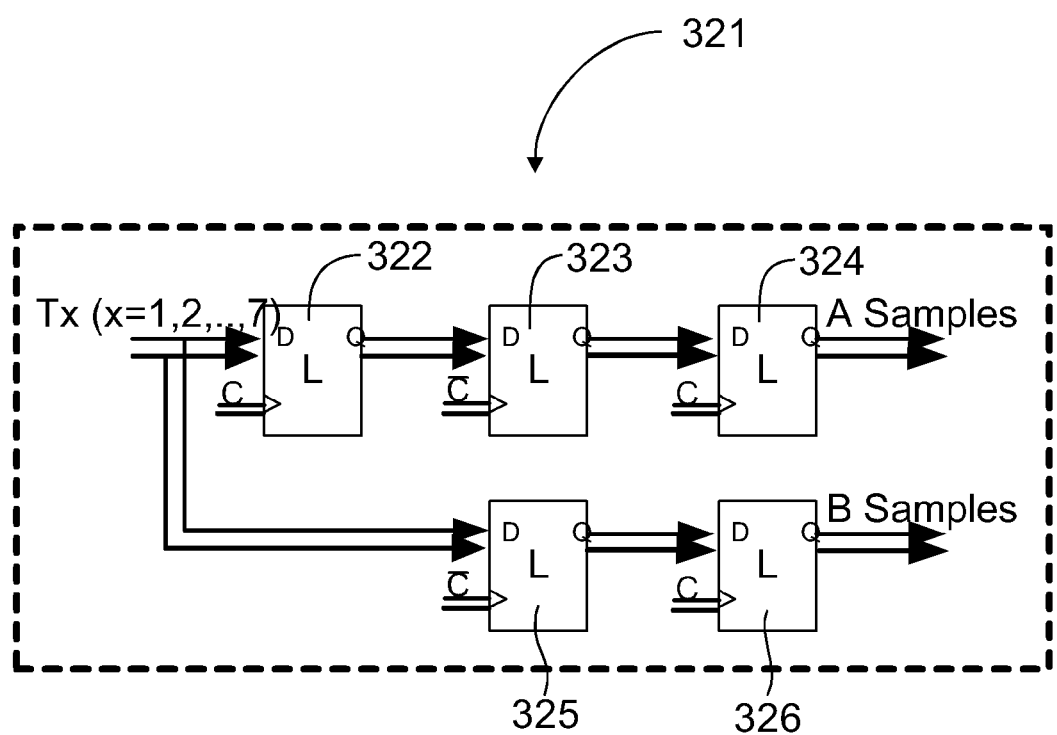
FIG. 17 shows an embodiment of a sampler comprised in the flash clock synchronizer of FIG. 15.

Each comparator shown in FIG. 16 provides its output to a sampler 321 shown in FIG. 17. Each sampler comprises five D-flip-flops 322 to 326. Each flip-flop generates a delay of half a clock period. Moreover, each flip-flop provides a pulse-shaping functionality. Since three flip-flops 322 to 324 are provided for A samples whereas two flip-flops 325 and 326 are provided for B samples, the difference between the sampling instances is compensated. The double connection lines indicate the symmetrical implementation of the sampler.

Figure 18:
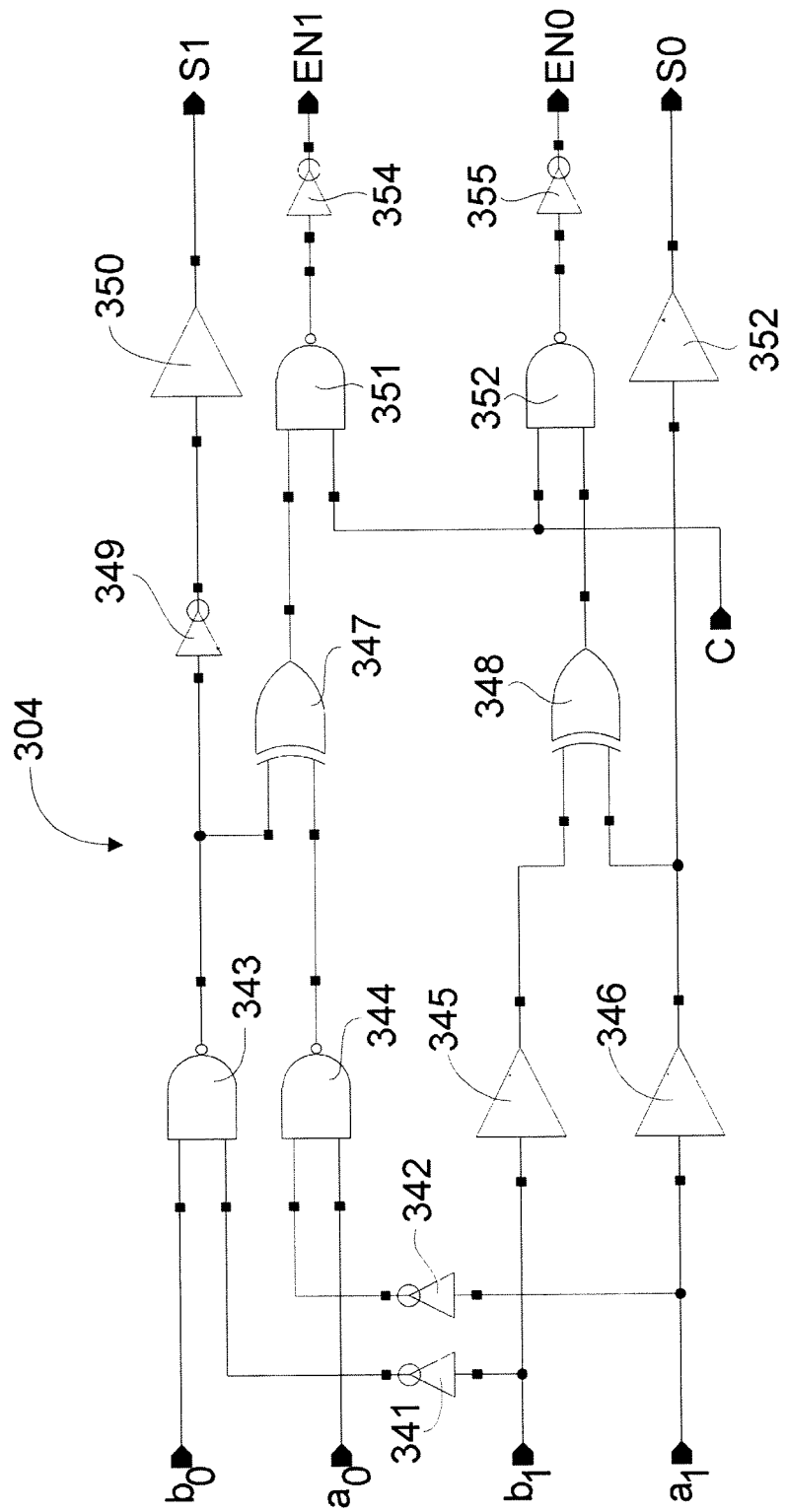
FIG. 18 shows a weighting circuit comprised in the flash clock synchronizer of FIG. 15.
Figure 19:
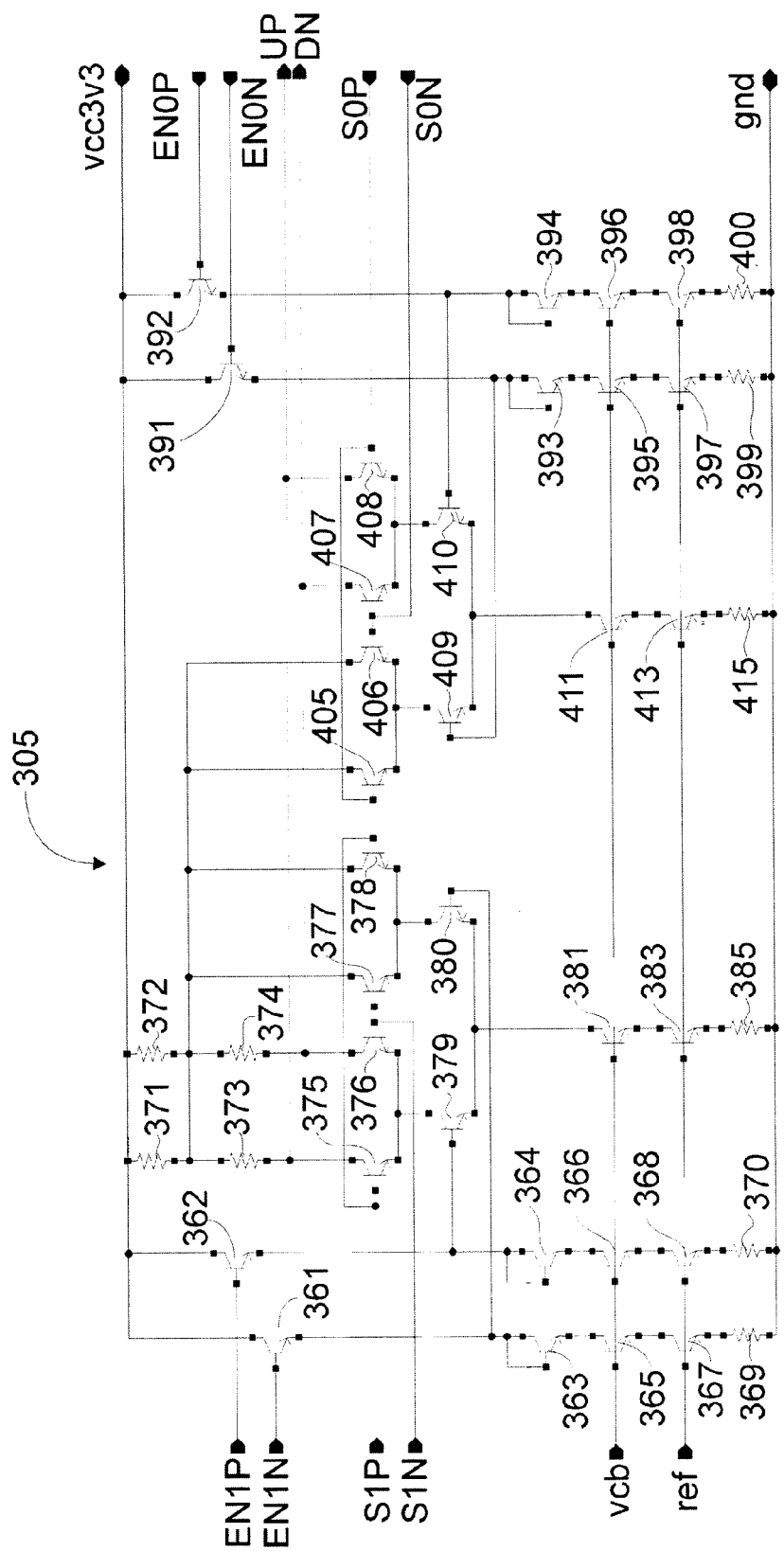
FIG. 19 shows a digital-to-analog converter comprised in the flash clock synchronizer of FIG. 15.

The weighting circuit 304 shown in FIG. 18 together with the DAC 305 shown in FIG. 19 provide the values PDout defined by equation (5). FIG. 18 shows a combinatorial logic circuit which does not show its symmetrical implementation.

On the left-hand side the least significant bits $b_0$, $a_0$, $b_1$ and $a_1$ are inputted. On the right-hand side the outputs S1, EN1, EN0 and S0 are provided. S0 and S1 are the sign bits of EN0 and EN1, respectively. EN1 and EN0 encode the amplitude. EN1 corresponds to a weight of 1 or 0. EN0 corresponds to a weight of 0.5 or 0. The behaviour of the weighting circuit 304 is illustrated by Table 2 to Table 7.

Providing two separate sign bits for each amplitude bit is not necessary from a logic point of view, rather it has advantages for the implementation of the high-speed digital-to-analog converter shown in FIG. 19. Consequently, if EN0 and EN1 are 0, the values of S0 and S1, respectively, do not influence the result and should be chosen in a way that keeps weighting circuit 304 simple. These combinations are marked by an "X" in Table 4 and Table 6. Table 5 and Table 7 show the real implementation in the weighting circuit 304.

TABLE 2

| | EN0 | | | |
| --- | --- | --- | --- | --- |
| | $a_1, a_0$ | | | |
| $b_1, b_0$ | 00 | 01 | 11 | 10 |
| 00 | 0 | 0 | 1 | 1 |
| 01 | 0 | 0 | 1 | 1 |
| 11 | 1 | 1 | 0 | 0 |
| 10 | 1 | 1 | 0 | 0 |

TABLE 3

| | En1 | | | |
| --- | --- | --- | --- | --- |
| | $a_1, a_0$ | | | |
| $b_1, b_0$ | 00 | 01 | 11 | 10 |
| 00 | 0 | 1 | 0 | 0 |
| 01 | 1 | 0 | 1 | 1 |
| 11 | 0 | 1 | 0 | 0 |
| 10 | 0 | 1 | 0 | 0 |

TABLE 4

| | S0, logic expression | | | |
| --- | --- | --- | --- | --- |
| | $a_1, a_0$ | | | |
| $b_1, b_0$ | 00 | 01 | 11 | 10 |
| 00 | X | X | 1 | 1 |
| 01 | X | X | 1 | 1 |
| 11 | 0 | 0 | X | X |
| 10 | 0 | 0 | X | X |

TABLE 5

| | S0, real implementation | | | |
| --- | --- | --- | --- | --- |
| | $a_1, a_0$ | | | |
| $b_1, b_0$ | 00 | 01 | 11 | 10 |
| 00 | 0 | 0 | 1 | 1 |
| 01 | 0 | 0 | 1 | 1 |
| 11 | 0 | 0 | 1 | 1 |
| 10 | 0 | 0 | 1 | 1 |

TABLE 6

S1, logic expression

| | $a_1, a_0$ | | | |
|---|---|---|---|---|
| $b_1, b_0$ | 00 | 01 | 11 | 10 |
| 00 | X | 0 | X | X |
| 01 | 1 | X | 1 | 1 |
| 11 | X | 0 | X | X |
| 10 | X | 0 | X | X |

TABLE 7

S1, real implementation

| | $a_1, a_0$ | | | |
|---|---|---|---|---|
| $b_1, b_0$ | 00 | 01 | 11 | 10 |
| 00 | 0 | 0 | 0 | 0 |
| 01 | 1 | 1 | 1 | 1 |
| 11 | 0 | 0 | 0 | 0 |
| 10 | 0 | 0 | 0 | 0 |

From a logic point of view, weighting circuit 304 does not need a clock. However, in order not to sum up delays caused by the logic gates comprised in weighting circuit 304, NAND gates 351 and 352 output EN1 and EN0 only during the second half of a clock cycle, during which clock C is high.

The digital-to-analog converter (DAC) 305 is symmetrical in some aspects. The signals EN0, EN1, S0 and S1 are provided symmetrically on lines EN0P, EN0N, EN1P, EN1N, S0P, S0N, S1P and S1N. As explained above, the last characters "P" and "N" designate positive and negative lines, respectively. The output is provided on lines UP and DN. Circuit elements handling a positive line are designated with odd numbers. The number designating the corresponding circuit element handling the corresponding negative line is greater by 1.

The left part of the DAC 305 comprises transistors 361 to 383 and resistors 369, 370, and 385, and handles signals EN1 and S1, whereas transistors 391 to 413 and resistors 399 to 415 handle signals EN0 and S0 and form a right part of DAC 305. The numbers designating matching elements differ by 30. Resistors 371 to 374 belong to both parts of DAC 305 and have a resistivity of 1 kΩ.

Matching components in the left and right parts of DAC 305 are identical apart from resistors 385 and 415. In connection with transistors 381, 383, 411 and 413, and reference voltages ref and vcb, resistors 385 and 415 form two current sources. The left current source provides double the current of the right current source.

In the following we will focus on the left part of DAC 305. The description of the right part is identical mutatis mutandis. If a logical 1 is applied to lines EN1P and EN1N, transistor 379 is conductive whereas transistor 380 is non-conductive. Consequently transistor 379 forwards the current provided by transistor 381 to transistors 375 and 376. If lines S1P and S1N provide a logical one, transistor 375 forwards the current to resistor 373 and output UP. Otherwise transistor 376 forwards the current to resistor 374 and output DN. The difference UP minus DN controls the frequency of the VCO 307. The difference could also be inverted. As mentioned above, the sign of the difference determines only which zero crossing in FIG. 2 is stable.

If a logical zero is applied to lines EN1 and EN1N, transistor 380 becomes conductive and forwards the current provided by transistor 381 to transistors 377 and 378. Transistors 377 and 378 are not really necessary but improve the circuit performance due to the their symmetry to transistors 375 and 376. Under these circumstances the left part of DAC 305 does not influence the output.

Transistors 361, 363, 365 and 367, and resistor 369 lower the potential of input line EN1N in order to adapt it to transistor 380. In a similar way, transistors 362, 364, 366 and 368, and resistor 370 lower the potential of input line EN1P in order to adapt it to transistor 379. The base voltages of transistors 379 and 380 must be somewhat lower than the base voltages of transistors 375 to 378.

In a similar fashion the right half of DAC 305 provides half the current either to resistor 373, or resistor 374 or none of these resistors. Further modifications and variations of the present invention will be apparent to those skilled in the art in view of this description. Accordingly, this description is to be construed as illustrative only and is for the purpose of teaching those skilled in the art the general manner of carrying out the present invention. It is to be understood that the forms of the invention shown and described herein are to be taken as the presently preferred embodiments.

| Reference numerals | |
|---|---|
| 1 | A samples |
| 2 | B samples |
| 3, 4 | thresholds |
| 5 | mean rectified value |
| 7 | first sampling phase |
| 8 | second sampling phase |
| 9 | symbol response |
| 11 | maxima of TEDC |
| 21 | sampler |
| 22 | oversampler |
| 23 | phase detector |
| 24 | loop filter |
| 25 | voltage-controlled oscillator |
| 26 | threshold control |
| 31 | quantizer |
| 32 | phase detector |
| 33 | loop filter |
| 34 | voltage-controlled oscillator |
| 35 | ADC |
| 41 | first set of comparators |
| 42 | assignment circuit |
| 43 | second set of comparators |
| 44 | assignment circuit |
| 45 | adder |
| 46 | resistors |
| 47 | low-pass filter |
| 50 | electrical signal |
| 51 | automatic gain control circuit |
| 52 | clock recovery circuit |
| 53 | sampling phase adjustment circuit |
| 61 | AND gates |
| 62 | NAND gates |
| 63 | OR gate |
| 64 | NOR gate |
| 65 | diodes |
| 66 | node |
| 67 | resistors |
| 68 | resistor |
| 69 | capacitor |
| 101-119 | steps |
| 201 | look-up table |
| 211-229 | steps |
| 251 | look-up table |
| 300 | flash clock synchronizer |
| 301 | quantizer |
| 302 | sampling circuit |
| 303 | thermo-to-Gray code converter |
| 304 | weighting circuit |

-continued

| Reference numerals | |
|---|---|
| 305 | digital-to-analog converter |
| 306 | loop filter |
| 307 | VCO |
| 311, 314 | transistors |
| 312, 315 | voltage divider |
| 313, 316 | current source |
| 317 | comparators |
| 321 | sampler |
| 322-326 | D-flip-flops |
| 341, 342, 349, 354, 355 | inverters |
| 345, 346, 350, 353 | delays |
| 343, 344, 351, 352 | NAND gates |
| 347, 348 | XOR gates |
| 361-368, 375-383, 391-398, 405-413 | transistors |
| 369-374, 385, 399, 400, 415 | resistors |
| $T_1$-$T_7$ | comparator outputs |

The invention claimed is:

1. A method comprising:
receiving an electrical signal having an amplitude range at a specialized non-uniform analog-to-digital converter, wherein the electrical signal was generated through optical-to-electrical conversion of an optical signal;
dividing, at the specialized non-uniform analog-to-digital converter, the amplitude range of the electrical signal into a plurality of subintervals to determine amplitude subintervals, wherein each of the amplitude intervals is assigned one of a plurality of weighting values;
sampling, at the specialized non-uniform analog-to-digital converter, the amplitude of the electrical signal twice within a bit interval to generate first and second amplitude samples;
determining, at the specialized non-uniform analog-to-digital converter, within which amplitude subintervals each of the first and second amplitude samples fall;
converting, at the specialized non-uniform analog-to-digital converter, the first and second samples into first and second weighting values corresponding to the amplitude subintervals within which the first and second amplitude samples fall;
generating, at a phase detector, a phase detector output based on the first and second weighting values;
filtering the phase detector output with a loop filter to generate a filtered output provided to a voltage controlled oscillator; and
generating, with the voltage controlled oscillator, a clock signal having a fixed phase relationship to the electrical signal.

2. The method of claim 1, further comprising:
providing the clock signal having a fixed phase relationship to the electrical signal to a sampling phase adjustment component configured to use the clock signal to dynamically optimize a data sampling phase of a data sampler operating on the electrical signal.

3. The method of claim 1, wherein the weighting values are chosen symmetrically to a zero amplitude level of a direct current (DC)-free signal.

4. The method of claim 1, wherein dividing the amplitude range of the electrical signal comprises:
non-uniformly dividing the amplitude range into a plurality of subintervals to determine non-uniform amplitude subintervals.

5. The method of claim 4, wherein dividing the amplitude range of the electrical signal further comprises:
dividing the amplitude range into five subintervals to determine five non-uniform amplitude subintervals.

6. The method of claim 1, wherein during conversion of the first sample into the first weighting values, the possible weighting values for the first sample are limited by predetermined first and second thresholds associated with the first sample and during conversion of the second sample into the second weighting values, the possible weighting values for the second sample are limited by predetermined first and second thresholds associated with the second sample.

7. The method of claim 6, wherein the first and second thresholds associated with the first sample are different from first and second thresholds associated with the second sample.

8. A system comprising:
a non-uniform analog-to-digital converter configured to:
receive an electrical signal having an amplitude range, wherein the electrical signal was generated through optical-to-electrical conversion of an optical signal;
divide the amplitude range of the electrical signal into a plurality of subintervals to determine amplitude subintervals, wherein each of the amplitude intervals is assigned one of a plurality of weighting values,
sample the amplitude of the electrical signal twice within a bit interval to generate first and second amplitude samples,
determine within which amplitude subintervals each of the first and second amplitude samples fall, and
convert the first and second amplitude samples into first and second weighting values corresponding to the amplitude subinterval within which the first and second amplitude samples fall;
a phase detector configured to generate a phase detector output using the first and second weighting values;
a loop filter configured to filter the phase detector output to generate a filtered output; and
a voltage controlled oscillator configured to generate a clock signal having a fixed phase relationship to the electrical signal.

9. The system of claim 8, further comprising a sampling phase adjustment component configured to receive the clock signal having a fixed phase relationship to the electrical signal from the voltage controlled oscillator and to use the clock signal to dynamically optimize a data sampling phase of a data sampler operating on the electrical signal.

10. The system of claim 8, wherein the non-uniform automatic gain control comprises an oversampler and a quantizer.

11. The system of claim 8, wherein the non-uniform automatic gain control uses weighting values that are symmetric to a zero amplitude level of a direct current (DC)-free signal.

12. The system of claim 8, wherein the non-uniform automatic gain control is configured to non-uniformly divide the amplitude range into a plurality of subintervals to determine non-uniform amplitude subintervals.

13. The system of claim 12, wherein the non-uniform automatic gain control is further configured to divide the amplitude range into five subintervals to determine five non-uniform amplitude subintervals.

14. The system of claim 8, wherein during conversion of the first sample into the first weighting values, the possible weighting values for the first sample are limited by predetermined first and second thresholds associated with the first sample and during conversion of the second sample into the second weighting values, the possible weighting values for the second sample are limited by predetermined first and second thresholds associated with the second sample.

15. The system of claim 14, wherein the first and second thresholds associated with the first sample are different from first and second thresholds associated with the second sample.

* * * * *